(12) United States Patent
Ebihara

(10) Patent No.: US 11,508,638 B2
(45) Date of Patent: Nov. 22, 2022

(54) SEMICONDUCTOR DEVICE AND POWER CONVERTER

(71) Applicant: Mitsubishi Electric Corporation, Tokyo (JP)

(72) Inventor: Kohei Ebihara, Tokyo (JP)

(73) Assignee: MITSUBISHI ELECTRIC CORPORATION, Tokyo (JP)

(*) Notice: Subject to any disclaimer, the term of this patent is extended or adjusted under 35 U.S.C. 154(b) by 0 days.

(21) Appl. No.: 17/251,819

(22) PCT Filed: Aug. 17, 2018

(86) PCT No.: PCT/JP2018/030514
§ 371 (c)(1),
(2) Date: Dec. 14, 2020

(87) PCT Pub. No.: WO2020/035938
PCT Pub. Date: Feb. 20, 2020

(65) Prior Publication Data
US 2021/0118761 A1 Apr. 22, 2021

(51) Int. Cl.
*H01L 23/31* (2006.01)
*H01L 23/24* (2006.01)
(Continued)

(52) U.S. Cl.
CPC ........ *H01L 23/3192* (2013.01); *H01L 23/24* (2013.01); *H01L 29/0619* (2013.01);
(Continued)

(58) Field of Classification Search
CPC . H01L 23/3192; H01L 23/24; H01L 29/0619; H01L 29/41775; H01L 29/7811;
(Continued)

(56) References Cited

U.S. PATENT DOCUMENTS

2013/0240909 A1* 9/2013 Hiramatsu .......... H01L 23/3121
 257/77
2015/0001554 A1* 1/2015 Imai .................... H01L 29/1608
 257/77

(Continued)

FOREIGN PATENT DOCUMENTS

JP 4-78539 A 3/1992
JP 2009-224642 A 10/2009
(Continued)

OTHER PUBLICATIONS

International Search Report and Written Opinion dated Oct. 16, 2018, received for PCT Application PCT/JP2018/030514, Filed on Aug. 17, 2018, 9 pages including English Translation.

*Primary Examiner* — S M Sohel Imtiaz
(74) *Attorney, Agent, or Firm* — Xsensus LLP

(57) ABSTRACT

A semiconductor substrate has a first surface and a second surface that includes an inner region and an outer region. The semiconductor substrate includes a drift layer of a first conductivity type and a terminal well region of a second conductivity type. The terminal well region includes a portion that extends from between the inner region and the outer region toward the outer region. A first electrode is on the first surface. A second electrode is on at least part of the inner region and electrically connected to the terminal well region, and has its edge located on a boundary between the inner region and the outer region. A peripheral structure is provided on part of the outer region, away from the second electrode. A surface protective film covers the edge of the second electrode and at least part of the outer region and has the peripheral structure engaged therein.

20 Claims, 15 Drawing Sheets

(51) Int. Cl.
*H01L 29/06* (2006.01)
*H01L 29/417* (2006.01)
*H01L 29/78* (2006.01)
*H01L 29/872* (2006.01)
*H02M 7/537* (2006.01)

(52) U.S. Cl.
CPC .... *H01L 29/41775* (2013.01); *H01L 29/7811* (2013.01); *H01L 29/872* (2013.01); *H02M 7/537* (2013.01)

(58) Field of Classification Search
CPC ... H01L 29/872; H01L 23/562; H01L 23/564; H01L 23/3171; H01L 29/402; H01L 29/66068; H01L 29/1608; H02M 7/537
See application file for complete search history.

(56) References Cited

U.S. PATENT DOCUMENTS

| | | | |
|---|---|---|---|
| 2017/0178989 A1* | 6/2017 | Matocha | H01L 29/7395 |
| 2017/0221998 A1* | 8/2017 | Ebihara | H01L 21/046 |
| 2017/0352604 A1* | 12/2017 | Hirao | H02M 7/537 |
| 2017/0352648 A1* | 12/2017 | Yasui | H01L 23/28 |
| 2018/0068894 A1* | 3/2018 | Mukherjee | H01L 29/0619 |
| 2018/0151719 A1* | 5/2018 | Sano | H01L 29/42356 |
| 2018/0226360 A1* | 8/2018 | Kamiya | H01L 24/29 |
| 2020/0127098 A1 | 4/2020 | Yamashiro et al. | |

FOREIGN PATENT DOCUMENTS

| | | |
|---|---|---|
| JP | 2013-211503 A | 10/2013 |
| JP | 2018-93177 A | 6/2018 |
| WO | 2018/084020 A1 | 5/2018 |

* cited by examiner

F I G. 1
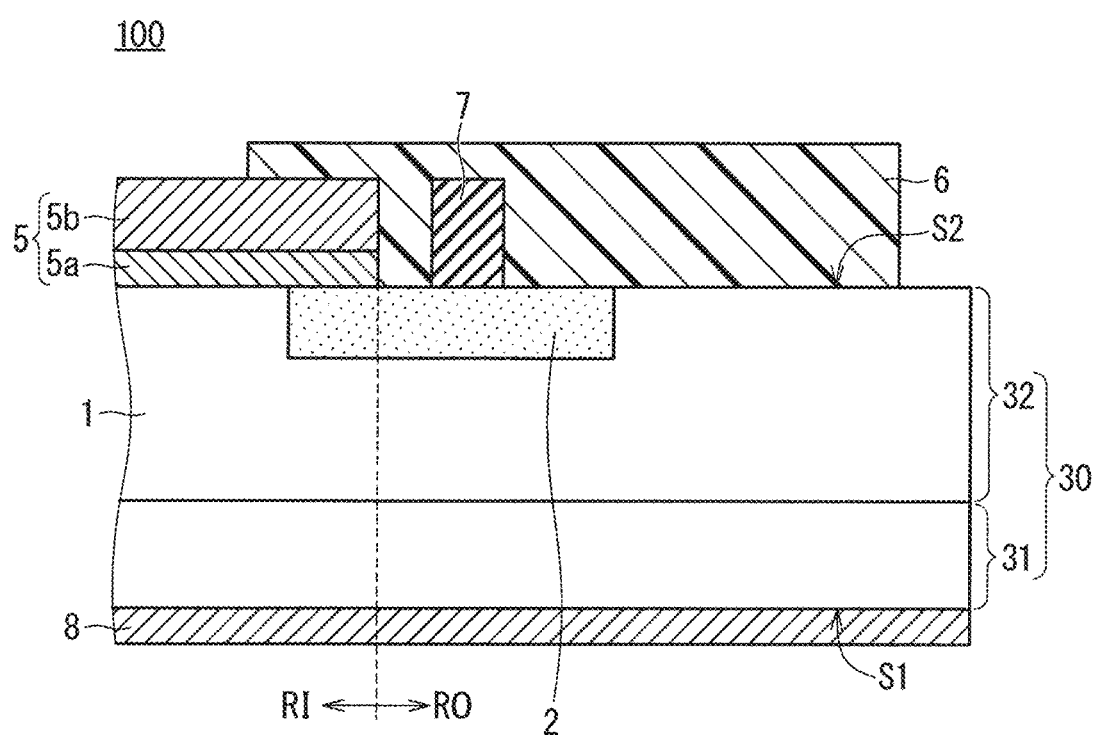

F I G. 3
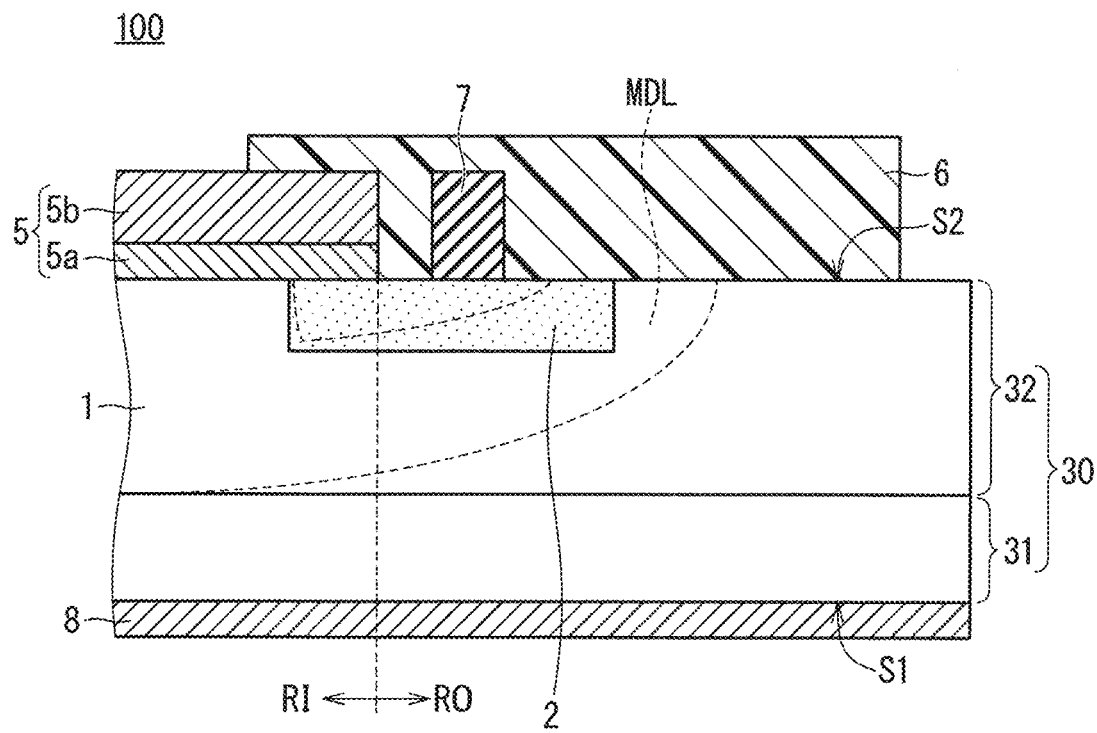
F I G. 4
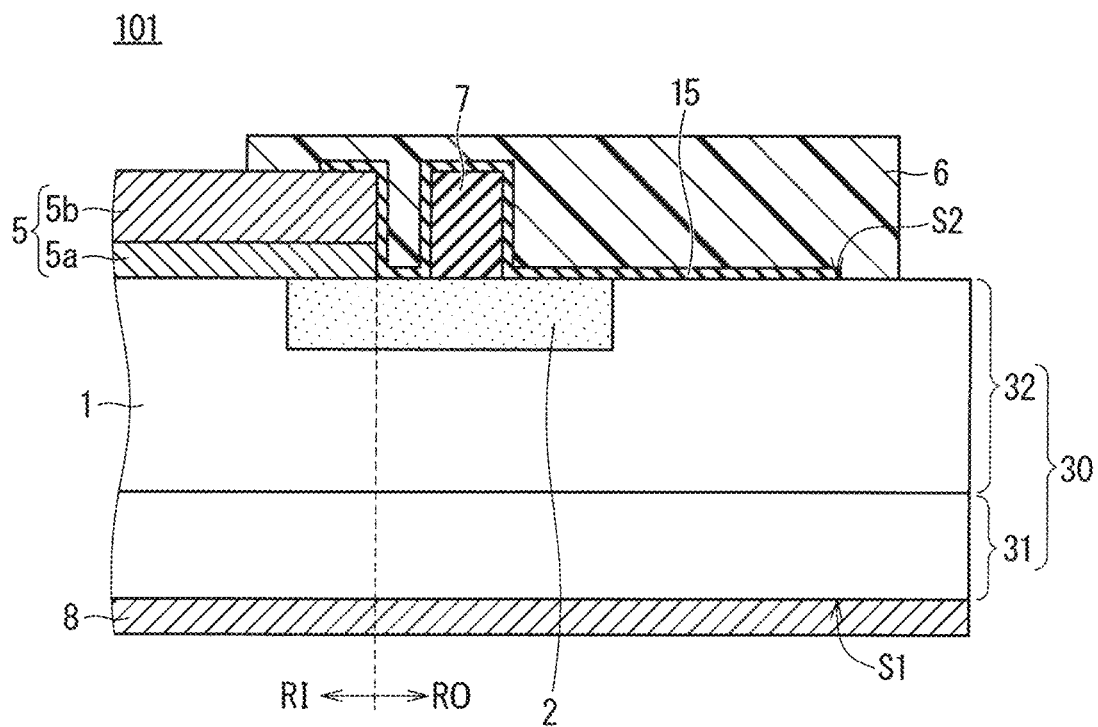

F I G. 5
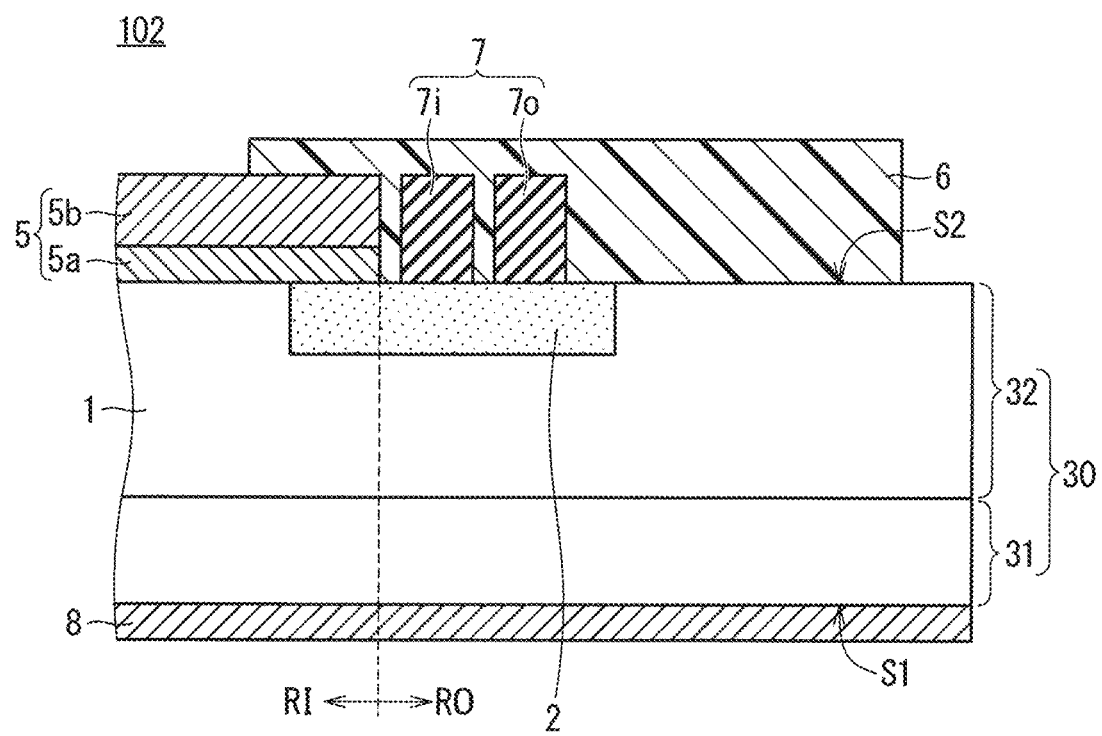

SEMICONDUCTOR DEVICE AND POWER CONVERTER

CROSS-REFERENCE TO RELATED APPLICATION

The present application is based on PCT filing PCT/JP2018/030514, filed Aug. 17, 2018, the entire contents of which are incorporated herein by reference.

TECHNICAL FIELD

The present invention relates to a semiconductor device and a power converter, and in particular to a semiconductor device including a surface protective film and a power converter using the semiconductor device.

BACKGROUND ART

In vertical semiconductor devices used in power devices or other devices, it is known that a p-type guard ring region (terminal well region) is provided in a so-called termination area of an n-type semiconductor layer in order to secure withstand voltage (see Japanese Patent Application Laid-Open No. 2013-211503 (Patent Document 1), for example). This forms a depletion layer around a pn junction between a semiconductor layer and the guard ring region, relieving an electric field developed upon application of a reverse voltage. In the Schottky barrier diode (SBD) described in the above publication, the surface electrode, other than some regions that undergo wire bonding, is covered with polyimide serving as a surface protective film. In some cases, this surface electrode may be further sealed with a sealing resin such as a gel. Such a surface protective film and a sealing resin are applicable not only to SBDs but also to other semiconductor devices such as metal oxide semiconductor field effect transistors (MOSFETs).

PRIOR ART DOCUMENT

Patent Document
Patent Document 1: Japanese Patent Application Laid-Open No. 2013-211503

SUMMARY

Problems to be Solved by the Invention

The surface protective film such as polyimide or the sealing resin such as a gel described above are prone to contain moisture at high humidity. This moisture may adversely affect the surface electrode. Specifically, the surface electrode may dissolve into the moisture, or the moisture may react with the surface electrode and cause a deposition of an insulator. In this case, separation of the surface protective film can easily occur at the interface between the surface electrode and the surface protective film. If a cavity formed by this separation acts as a leakage path, the insulation reliability of the semiconductor device may become impaired.

The present invention has been made in order to solve the problems as described above, and it is an object of the present invention to provide a semiconductor device that can improve its insulation reliability.

Means to Solve the Problem

The semiconductor device according to the present invention includes a semiconductor substrate, a first electrode, a second electrode, a peripheral structure, and a surface protective film. The semiconductor substrate has a first surface and a second surface opposite to the first surface, the second surface including an inner region and an outer region outside the inner region. The semiconductor substrate includes a drift layer of a first conductivity type and a terminal well region of a second conductivity type different from the first conductivity type. The terminal well region includes a portion that extends from between the inner region and the outer region toward the outer region in the second surface. The first electrode is provided on the first surface of the semiconductor substrate. The second electrode is provided on at least part of the inner region of the semiconductor substrate and electrically connected to the terminal well region, and has an edge located on a boundary between the inner region and the outer region. The peripheral structure is provided on part of the outer region of the semiconductor substrate, away from the second electrode. The surface protective film covers the edge of the second electrode and at least part of the outer region of the semiconductor substrate, has the peripheral structure engaged therein, and is made of an insulating material different from a material for the peripheral structure.

Effects of the Invention

According to the present invention, the surface protective film is made of a material different from the material for the peripheral structure. Thus, a material having an excellent capability of relieving stresses caused by the influence of an external environment can be appropriately selected as the material for the surface protective film. On the other hand, the material for the peripheral structure, which may be different from the material for the surface protective film, can be selected by prioritizing the purpose of suppressing separation of the peripheral structure from the semiconductor substrate. Here, the peripheral structure is engaged in the surface protective film, so that the surface protective film is not easily separated from the peripheral structure. Thus, even if the surface protective film starts to be separated from the vicinity of the outer peripheral edge of the second electrode, this separation is prevented from extending to the outside beyond the vicinity of the peripheral structure. Accordingly, the surface protective film can maintain insulation protection in the range from the peripheral structure to the outside. This improves the insulation reliability of the semiconductor device.

The objects, features, aspects and advantages of the present invention will become more apparent from the following detailed description when taken into conjunction with the accompanying drawings.

BRIEF DESCRIPTION OF DRAWINGS

FIG. 1 is a partial sectional view taken along line I-I in FIG. 2 and schematically illustrating a configuration of an SBD as an example of a semiconductor device according to Embodiment 1 of the present invention.

FIG. 3 is a partial sectional view schematically illustrating an example of the distribution of a maximum depletion layer in the SBD illustrated in FIG. 1.

FIG. 4 is a partial sectional view of an SBD as a variation of the semiconductor device according to Embodiment 1 of the present invention.

FIG. 5 is a partial sectional view of an SBD as another variation of the semiconductor device according to Embodiment 1 of the present invention.

DESCRIPTION OF EMBODIMENTS

Embodiments will be described hereinafter with reference to the accompanying drawings. The drawings are illustrated in schematic form, and sizes and relative positions of images illustrated in different drawings are not always accurate and may be changed appropriately. In the following description, similar constituent elements are illustrated with the same reference signs and assumed to be similar in name and function. Thus, a detailed description thereof may be omitted in some cases. In the specification of the present invention, the terms "on" and "cover" do not eliminate the possibility of the presence of inclusions between constituent elements. For example, the languages "B provided on A" and "A covers B" may mean both cases where another constituent element C is provided between A and B and where there are no other constituted elements between A and B. In the following description, terms such as "upper," "lower," "side," "bottom," "front," and "rear" may be used to refer to specific positions and specific directions, but these terms are merely used for convenience's sake in order to facilitate understanding of the content of embodiments, and do not relate to positions and directions in actual implementations.

Embodiment 1

Configuration

Figure 2:
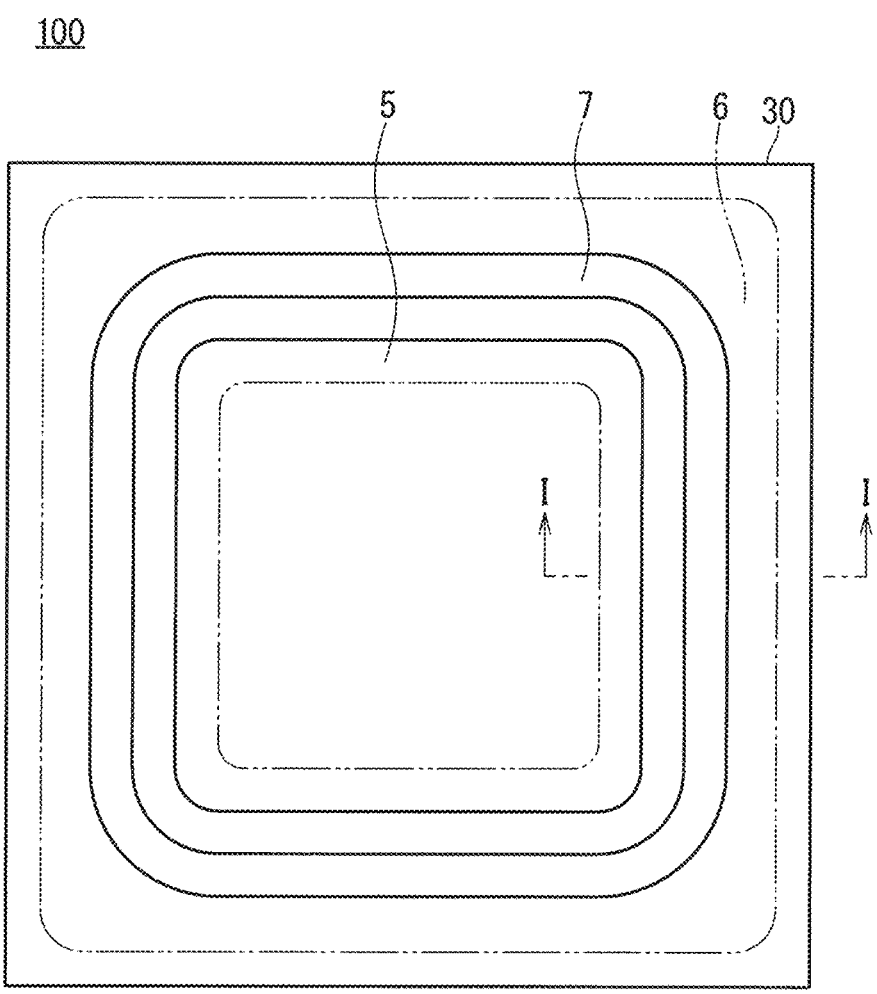
FIG. 2 is a top view schematically illustrating the configuration of the SBD as an example of the semiconductor device according to Embodiment 1 of the present invention.

FIG. 1 is a partial sectional view taken along line I-I in FIG. 2 and schematically illustrating a configuration of an SBD 100 (semiconductor device) according to Embodiment 1 of the present invention. FIG. 2 is a top view schematically illustrating the configuration of the SBD 100. In FIG. 1, the right side corresponds to the termination side of the SBD 100, and the left side corresponds to the active-region side on which principal current flows in an ON state.

The SBD 100 includes an epitaxial substrate 30 (semiconductor substrate), a rear surface electrode 8 (first electrode), a front surface electrode 5 (second electrode), a peripheral structure 7, and a surface protective film 6. In the present embodiment, the epitaxial substrate 30 is made of polytype 4H silicon carbide (SiC). Thus, the SBD 100 is an SiC-SBD. The epitaxial substrate 30 has a rear surface S1 (first surface) and a front surface S2 (second surface opposite to the first surface). The front surface S2 includes an inner region RI and an outer region RO located outward of the inner region. The epitaxial substrate 30 includes a monocrystalline substrate 31 (support substrate) forming the rear surface S1, and an epitaxial layer 32 (semiconductor layer) arranged on the monocrystalline substrate 31 and forming the front surface S2.

In the present embodiment, the epitaxial layer 32 includes a drift layer 1 and a terminal well region 2 (guard ring region). The drift layer 1 according to the present embodiment is of the same conductivity type as the conductivity type of the monocrystalline substrate 31 and is specifically of an n-type (first conductivity type). The terminal well region 2 is of a p-type (second conductivity type different from the first conductivity type). The terminal well region 2 is isolated from the monocrystalline substrate 31 by the drift layer 1. In other words, the terminal well region 2 is formed in a surface layer of the epitaxial layer 32. The drift layer 1 has a lower impurity concentration than the impurity concentration of the monocrystalline substrate 31. Thus, the monocrystalline substrate 31 has a lower resistivity than the resistivity of the drift layer 1. The impurity concentration of the drift layer 1 is higher than or equal to $1 \times 10^{14}/cm^3$ and lower than or equal to $1 \times 10^{17}/cm^3$. In the front surface S2, the terminal well region 2 includes a portion that extends from between the inner region RI and the outer region RO toward the outer region RO. In other words, the terminal well region 2 spans the boundary between the inner region RI and the outer region RO.

The rear surface electrode 8 is provided on the rear surface S1 of the epitaxial substrate 30.

The front surface electrode 5 is provided on at least part of the inner region RI of the epitaxial substrate 30 and has its edge located on the boundary between the inner region RI and the outer region RO. In the present embodiment, the front surface electrode 5 is provided on the entire inner region RI and is not provided on the outer region RO. The front surface electrode 5 includes a Schottky electrode 5a and an electrode pad 5b.

The Schottky electrode 5a is in contact with the inner region RI of the front surface S2 and specifically in contact with the drift layer 1 and the terminal well region 2. Thus, the front surface electrode 5 is electrically connected to the terminal well region 2. In the present embodiment, the Schottky electrode 5a may be made of a metal that forms a Schottky junction with an n-type SiC semiconductor, such as titanium (Ti), molybdenum (Mo), nickel (Ni), gold (Au), or tungsten (W). The Schottky electrode 5a preferably has a thickness greater than or equal to 30 nm and less than or equal to 300 nm. For example, the Schottky electrode 5a is a Ti film with a thickness of 100 nm.

The electrode pad 5b is arranged on the Schottky electrode 5a. The electrode pad 5b may be made of, for example, a metal that contains any of aluminum (Al), copper (Cu), Mo, and Ni, or an Al alloy such as Al-silicon (Si). The electrode pad 5b preferably has a thickness greater than or equal to 300 nm and less than or equal to 10 μm. For example, the electrode pad 5b is an Al film with a thickness of 3 μm.

The peripheral structure 7 is provided on part of the outer region RO of the epitaxial substrate 30, away from the front surface electrode 5. The distance between the peripheral structure 7 and the front surface electrode 5 is preferably less than or equal to the thickness of at least one of the front surface electrode 5 and the peripheral structure 7, and more preferably less than or equal to the thickness of each of the front surface electrode 5 and the peripheral structure 7. The outer peripheral edge (right edge in FIG. 1) of the peripheral structure 7 is located inward (leftward in FIG. 1) of the outer peripheral edge (right edge in FIG. 1) of the terminal well region 2. Thus, the peripheral structure 7 is arranged on the terminal well region 2. The peripheral structure 7 is made of an insulating material such as silicon oxide ($SiO_2$) or silicon nitride (SiN) and preferably has a thickness greater than or equal to 200 nm. For example, the peripheral structure 7 is an $SiO_2$ film with a thickness of 2 μm.

The surface protective film 6 covers the edge of the front surface electrode 5 and specifically covers the edge of the electrode pad 5b. Thus, an outer peripheral portion of the upper face of the electrode pad 5b is covered with the surface protective film 6. The surface protective film 6 also covers at least part of the outer region RO of the epitaxial substrate 30. The surface protective film 6 has an opening above a central portion (left portion in the drawing) of the electrode pad 5b so as allow the electrode pad 5b to function as an external terminal. The peripheral structure 7 is engaged in the surface protective film 6. The surface protective film 6 is made of an insulating material different from the material for the peripheral structure 7. The material for the surface protective film 6 is preferably a resin such as polyimide in order to relieve stresses caused by an external environment.

FIG. 3 is a partial sectional view schematically illustrating an example of the distribution of a maximum depletion layer MDL, i.e., a depletion layer that extends from the boundary between the drift layer 1 and the terminal well region 2 when a maximum voltage, which will be described in detail later, is applied to the SBD 100. As illustrated, the peripheral structure 7 is preferably spaced inward (leftward in the drawing) from the maximum depletion layer MDL.

In the present embodiment described above, the first conductivity type is an n-type and the second conductivity type is a p-type, but instead, the first conductivity type may be a p-type and the second conductivity type may be an n-type. The epitaxial substrate 30 is made of SiC, which is one type of a wide-bandgap material, but instead of SiC, other wide-bandgap materials may be used. As another alternative, other materials such as silicon (Si) may be used, instead of a wide-bandgap material. The semiconductor device may be a diode other than an SBD, and for example, may be a pn junction diode or a junction barrier Schottky (JBS) diode.

Variations

FIG. 4 is a partial sectional view of an SBD 101 as a first variation of the SBD 100 (FIG. 1). The SBD 101 includes a moisture-resistant insulating film 15 between the front surface electrode 5 and the surface protective film 6. Specifically, the moisture-resistant insulating film 15 is arranged on the outer peripheral edge of the electrode pad 5b, on the peripheral structure 7, and on part of the epitaxial layer 32. Note that the surface protective film 6 may completely cover the moisture-resistant insulating film 15, although it does not need to cover part of the moisture-resistant insulating film 15. The moisture-resistant insulating film 15 is made of a material different from the material for the surface protective film 6 and specifically made of a material having less moisture permeability than the material for the surface protective film 6. The material for the moisture-resistant insulating film 15 is preferably a material having less moisture permeability than $SiO_2$ and is, for example, SiN. Preferably, SiN has a resistivity higher than or equal to $10 \times 10^{12}$ Ωcm, instead of having semi-insulating properties as a result of being rich in Si. The moisture-resistant insulating film 15 has a thickness of, for example, greater than or equal to 100 nm.

FIG. 5 is a partial sectional view of an SBD 102 as a second variation of the SBD 100 (FIG. 1). In the SBD 102, the peripheral structure 7 includes an outer portion 7o and an inner portion 7i that is spaced from the outer portion 7o and located between the outer portion 7o and the front surface electrode 5. The surface protective film 6 is engaged in the space between the inner portion 7i and the outer portion 7o.

Figure 6:
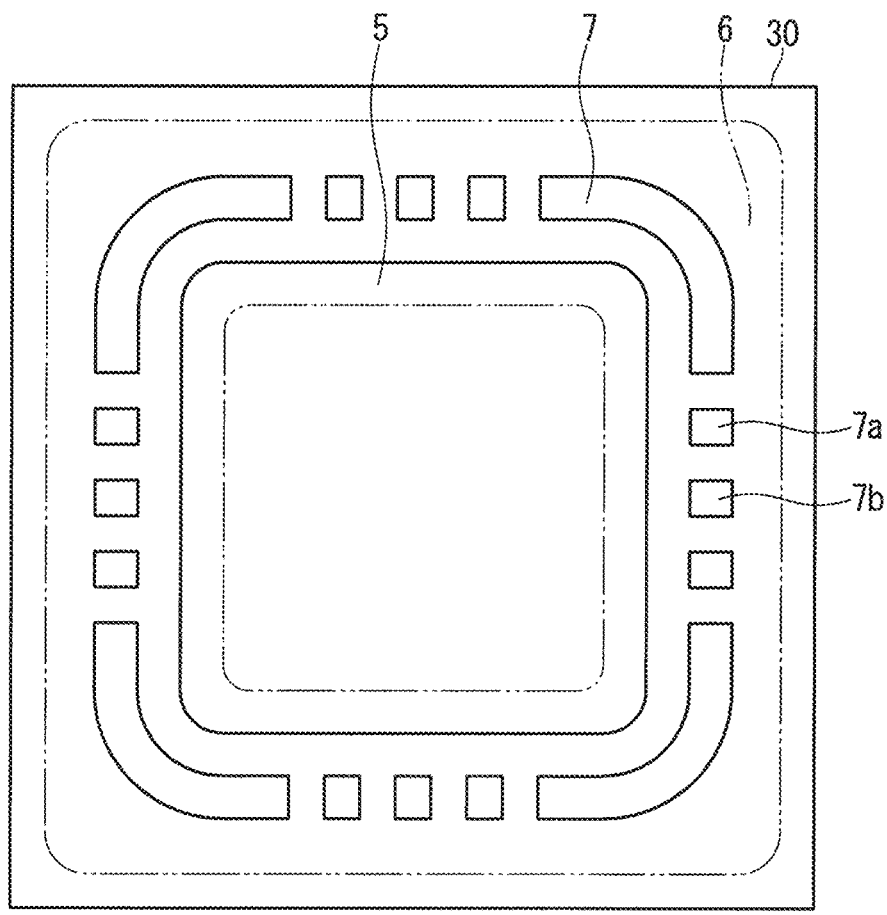
FIG. 6 is a top view of an SBD as another variation of the semiconductor device according to Embodiment 1 of the present invention.

FIG. 6 is a top view of an SBD 103 as a third variation of the SBD 100 (FIG. 2). In the SBD 103, the peripheral structure 7 includes a plurality of portions spaced from one another, and these portions include portions 7a (first portions) and portions 7b (second portions) spaced from the portions 7a. According to this variation, the peripheral structure 7 does not completely surround the front surface electrode 5. In other words, assuming a shape that completely surrounds the front surface electrode 5, the peripheral structure 7 has a shape obtained by dividing the assumed shape so as to provide a communication between the inner peripheral side and the outer peripheral side of this shape at one or more locations. The surface protective film 6 is engaged in the spaces between the front surface electrode 5 and the portions 7a, the spaces between the front surface electrode 5 and the portions 7b, and the spaces between the portions 7a and the portions 7b of the peripheral structure 7. The distances between the portions 7a and the portions 7b are preferably less than or equal to the thickness of the peripheral structure 7.

Here, the portions of the above assumed shape where the peripheral structure 7 is not provided are defined as "communicating regions." The surface protective film 6 is engaged in the communicating regions. If there are a plurality of communicating regions, the intervals therebetween may be greater than or equal to the thickness of the peripheral structure 7. Preferably, the aforementioned communicating regions are not provided in the vicinity of corners where the front surface electrode 5 has a curvature in plan view.

Manufacturing Method

Next, an example of a method for manufacturing the SBD 100 according to Embodiment 1 of the present invention will be described.

First, the monocrystalline substrate 31 made of an n$^+$ type low-resistance SiC semiconductor and having an off angle is prepared. On the monocrystalline substrate 31, the epitaxial layer 32 including a portion that is made into the drift layer 1 is formed by epitaxially growing SiC having an n-type impurity concentration higher than or equal to $1 \times 10^{14}/\text{cm}^3$ and lower than or equal to $1 \times 10^{17}/\text{cm}^3$.

Then, a resist film of a predetermined shape (not shown) is formed by a photolithographic process. Using the resist film as an implantation mask, p-type impurity (acceptor) ions such as Al or boron (B) ions are implanted so as to form the p-type terminal well region 2 in the surface portion of the drift layer 1. The dose (impurity concentration) of the terminal well region 2 is preferably higher than or equal to $0.5 \times 10^{13}/\text{cm}^2$ and lower than or equal to $5 \times 10^{13}/\text{cm}^2$ and is, for example, $1.0 \times 10^{13}/\text{cm}^2$. In the case of Al ion implantation, implantation energy is, for example, higher than or equal to 100 keV and lower than or equal to 700 keV. In this case, the impurity concentration converted from the above dose [cm$^{-2}$] is higher than or equal to $1 \times 10^{17}/\text{cm}^3$ and lower than or equal to $1 \times 10^{19}/\text{cm}^3$. Thereafter, annealing is conducted by heat treatment equipment for 30 seconds or more and 1 hour or less in an inert gas atmosphere such as an argon (Ar) gas (at a temperature higher than or equal to 1300° C. and lower than or equal to 1900° C.). This annealing activates the impurity implanted by the ion implantation.

Next, an SiO$_2$ film with a thickness of 2 μm is deposited on the front surface S2 by CVD, for example. Thereafter, the SiO$_2$ film is patterned by a photolithographic process and an etching process. This forms the peripheral structure 7 on part of the surface of the epitaxial substrate 30 and specifically on part of the surface of the terminal well region 2. In the case where the peripheral structure 7 includes a plurality of portions spaced from each other as in the SBD 102 (FIG. 5) or the SBD 103 (FIG. 6) according to the variation, a corresponding photolithographic process is performed.

Then, the rear surface electrode 8 is formed by, for example, sputtering on the rear surface S1 of the epitaxial substrate 30. Note that the rear surface electrode 8 may be formed after completion of all of the following processes that are performed on the front surface S2 side.

Next, the material for the Schottky electrode 5a and the material for the electrode pad are deposited in this order by, for example, sputtering on the entire front surface S2 where the peripheral structure 7 is provided. For example, a Ti film with a thickness of 100 nm and an Al film with a thickness of 3 μm are deposited in this order. Next, the Schottky electrode 5a and the electrode pad 5b of desired shapes are formed by patterning using a photolithographic process and an etching process. Dry etching or wet etching can be used to etch the metal films. As an etchant in the wet etching, a hydrofluoric acid (HF)-based or phosphoric acid-based etchant is used. Note that the patterning of the Schottky electrode 5a and the patterning of the electrode pad 5b may be performed separately. In this case, a resultant structure may be such that the outer peripheral edge of the electrode pad 5b juts out the outer peripheral edge of the Schottky electrode 5a so that the electrode pad 5b completely covers the Schottky electrode 5a. Alternatively, a resultant structure may be such that the outer peripheral edge of the Schottky electrode 5a juts out the outer peripheral edge of the electrode pad 5b so that part of the Schottky electrode 5a is not covered with the electrode pad 5b. The distance between the electrode pad 5b and the peripheral structure 7 is preferably less than or equal to a total thickness of the Schottky electrode 5a and the electrode pad 5b (in the example using the above dimensions, 3.0+0.1=3.1 μm) or preferably less than or equal to the thickness of the peripheral structure 7 (in the example using the above dimension, 2 μm).

Here, in the case of manufacturing the SBD 101 (FIG. 4) according to the variation, SiN is deposited by, for example, plasma CVD on the front surface S2 where the front surface electrode 5 and the peripheral structure 7 are provided. Next, the moisture-resistant insulating film 15 of a desired shape is formed by patterning using a photolithographic process and an etching process. The moisture-resistant insulating film 15 preferably has a thickness greater than or equal to 100 nm and, for example, has a thickness of 1 μm.

Next, the surface protective film 6 is formed so as to cover the outer peripheral edge of the electrode pad 5b and the front surface S2 where the peripheral structure 7 is provided. For example, the surface protective film 6 may be formed into a desired shape by applying and exposing a coating of photosensitive polyimide. In this way, the SBD 100 is obtained.

Operations

Next, operations of the SBD 100 (FIG. 1) according to the present embodiment will be described.

When a negative voltage, with reference to the potential of the electrode pad 5b of the front surface electrode 5, is applied to the rear surface electrode 8, the SBD 100, i.e., SiC-SBD, enters a state in which current flows from the front surface electrode 5 to the rear surface electrode 8, i.e., a conducting state (ON state). Conversely, when a positive voltage is applied to the rear surface electrode 8 with reference to the front surface electrode 5, the SBD 100 enters a blocking state (OFF state).

Referring to FIG. 3, when the SBD 100 is in the OFF state, a large electric field is applied to the surface of the active region of the drift layer 1 and to the vicinity of the interface of the pn junction between the drift layer 1 and the terminal well region 2. A voltage that is applied to the rear surface electrode 8 when this electric field reaches a critical field and causes an avalanche breakdown is defined as a maximum voltage (avalanche voltage). Ordinarily, the SBD 100 is used in a range in which an avalanche breakdown does not occur, and the rated voltage thereof is prescribed in that range.

In the OFF state, a depletion layer expands from the surface of the active region of the drift layer 1 and the interface of the pn junction between the drift layer 1 and the terminal well region 2 in a direction toward the monocrystalline substrate 31 (the down direction in the drawing) and in a direction toward the outer periphery of the drift layer 1 (the right direction in the drawing). The depletion layer also expands from the interface of the pn junction between the drift layer 1 and the terminal well region 2 to the inside of the terminal well region 2, and the degree of expansion depends greatly on the concentration of the terminal well region 2. Here, the position indicated by the dotted line is the tip position of the maximum depletion layer MDL. At this time, a potential difference occurs in a depleted region of the surface of the epitaxial layer 32 from the outer peripheral side of the epitaxial layer 32 toward the center thereof.

Here, consider a case where the SBD 100 enters the OFF state at high humidity. The surface protective film 6, which has a high water absorbing property, contains a large amount of moisture at high humidity. This moisture reaches the surfaces of the epitaxial layer 32 and the electrode pad 5b. Here, the voltage applied to the SBD 100 causes the outer peripheral side of the drift layer 1 to act as an anode and causes the electrode pad 5b to act as a cathode. In the vicinity of the electrode pad 5b serving as a cathode, the above moisture causes a reduction reaction of oxide expressed by Expression (1) and a production reaction of hydrogen expressed by Expression (2).

$$O_2 + 2H_2O + 4e^- \rightarrow 4OH^- \qquad (1)$$

$$H_2O + e^- \rightarrow OH^- + \tfrac{1}{2}H_2 \qquad (2)$$

Following this, the concentration of hydroxide ions increases in the vicinity of the electrode pad 5b. The hydroxide ions chemically react with the electrode pad 5b. For example, in the case where the electrode pad 5b is made of aluminum, the above chemical reaction may transform the aluminum into aluminum hydroxide. The aluminum hydroxide is deposited as an insulator on the surface of the electrode pad 5b. In the case where the epitaxial substrate 30 is made of SiC, the width of the terminal well region 2 and the width from the terminal well region 2 to the outer peripheral edge of the drift layer 1 can be designed to be small by making use of a high dielectric breakdown electric field of SiC. In this design, the distance between the outer peripheral side of the drift layer 1 serving as an anode and the electrode pad 5b serving as a cathode in the OFF state decreases. Thus, the concentration of hydroxide ions increases more in the vicinity of the electrode pad 5b. Accordingly, the deposition of the insulator on the surface of the electrode pad 5b becomes more apparent. At this time, at the outer peripheral edge (right edge in FIG. 3) of the electrode pad 5b, the insulator is deposited on the upper and side faces of the electrode pad 5b. This deposition forces the surface protective film 6 up and may consequently cause separation at the interface between the electrode pad 5b and the surface protective film 6. The separation of the surface protective film 6 may propagate over the surface of the epitaxial layer 32. In other words, the separation may also occur at the interface between the epitaxial layer 32 and the surface protective film 6. If this separation forms a cavity above the terminal well region 2, an excessive flow of leakage current may occur due to intrusion of moisture into the cavity, or a device breakdown of the SBD 100 may be caused by, for example, aerial discharge in the cavity.

According to the present embodiment, the peripheral structure 7 is provided on the outer peripheral side of the electrode pad 5b. The peripheral structure 7 can thus prevent the separation of the surface protective film 6 from the epitaxial layer 32, which occurs from the outer peripheral edge of the electrode pad 5b toward the outer periphery of the drift layer 1.

Summary of Effects

The surface protective film 6 is made of a material different from the material for the peripheral structure 7. Thus, a material having an excellent capability of relieving stresses caused by the influence of an external environment can be appropriately selected as the material for the surface protective film 6. On the other hand, the material for the peripheral structure 7, which may be different from the material for the surface protective film 6, can be selected by prioritizing the purpose of suppressing separation of the peripheral structure 7 from the epitaxial substrate 30. Here, since the peripheral structure 7 is engaged in the surface protective film 6, the separation of the surface protective film 6 from the peripheral structure 7 does not readily occur. Thus, even if the surface protective film 6 starts to be separated from the vicinity of the outer peripheral edge of the front surface electrode 5, this separation is prevented from extending to the outside beyond the vicinity of the peripheral structure 7. Accordingly, the surface protective film 6 can maintain insulation protection in the range from the peripheral structure 7 to the outside. This improves the insulation reliability of the SBD 100.

The outer peripheral edge (right edge in FIG. 1) of the peripheral structure 7 is located inward (leftward in FIG. 1) of the outer peripheral edge (right edge in FIG. 1) of the terminal well region 2. This prevents the separation of the surface protective film 6 from extending beyond the outer peripheral edge of the terminal well region 2. Accordingly, it is possible to avoid a situation in which a leakage path arising from the above separation causes a short circuit in the pn junction formed by the drift layer 1 and the terminal well region 2.

The peripheral structure 7 is preferably spaced from the maximum depletion layer MDL. This prevents the separation of the surface protective film 6 from extending to a region in which the maximum depletion layer MDL comes in contact with the front surface S2. Accordingly, it is possible to avoid a situation in which a leakage path arising from the above separation causes a short circuit in the depletion layer.

The distance between the peripheral structure 7 and the front surface electrode 5 is preferably less than or equal to the thickness of at least either of the front surface electrode 5 and the peripheral structure 7, and more preferably less than or equal to the thickness of each of the front surface electrode 5 and the peripheral structure 7. This increases the aspect ratio of a recess formed by the front surface electrode 5 and the peripheral structure 7. Thus, the surface protective film 6 is more firmly fixed to this recess. Accordingly, even if the surface protective film 6 starts to be separated from the vicinity of the outer peripheral edge of the front surface electrode 5, this separation is more reliably prevented from extending to the outside beyond the vicinity of the peripheral structure 7.

In the SBD 100 using the epitaxial substrate 30 made of SiC, an insulator is readily deposited around the front surface electrode 5 by the influence of moisture as described above. This deposition may result in separation of the surface protective film 6 in the vicinity of the outer peripheral edge of the front surface electrode 5. The present embodiment effectively prevents this separation from extending to the outside beyond the vicinity of the peripheral structure 7.

Referring to FIG. 4, the moisture-resistant insulating film 15 may be provided between the front surface electrode 5 and the surface protective film 6. This suppresses moisture penetration into the outer peripheral edge of the front surface electrode 5. Accordingly, it is possible to suppress the occurrence of separation of the surface protective film 6 in the vicinity of the outer peripheral edge of the front surface electrode 5 caused by the influence of moisture.

Referring to FIG. 5, the surface protective film 6 may be engaged in between the inner portion 7i and the outer portion 7o of the peripheral structure 7. This allows the surface protective film 6 not only to be firmly fixed in the space between the front surface electrode 5 and the inner portion 7i of the peripheral structure 7 but also to be firmly fixed in the space between the inner portion 7i and the outer portion 7o of the peripheral structure 7 in the direction from the front surface electrode 5 to the outside. Accordingly, even if the surface protective film 6 starts to be separated from the vicinity of the outer peripheral edge of the front surface electrode 5, this separation is more reliably prevented from extending to the outside beyond the vicinity of the peripheral structure 7. In the case where the interval between the inner portion 7i and the outer portion 7o is less than or equal to the thickness of the peripheral structure 7, the aspect ratio of the recess formed by the inner portion 7i and the outer portion 7o increases. Thus, the surface protective film 6 is more firmly fixed to this recess. Accordingly, even if the surface protective film 6 starts to be separated from the vicinity of the outer peripheral edge of the front surface electrode 5, this separation is more reliably prevented from extending to the outside beyond the vicinity of the peripheral structure 7.

Referring to FIG. 6, the surface protective film 6 may be engaged in between the front surface electrode 5 and the portions 7a of the peripheral structure 7 (FIG. 6), between the front surface electrode 5 and the portions 7b of the peripheral structure 7 (FIG. 6), and between the portions 7a and 7b. This increases the number of places where the surface protective film 6 is firmly fixed to the peripheral structure 7 as a result of this engagement. Accordingly, even if the surface protective film 6 starts to be separated from the vicinity of the outer peripheral edge of the front surface electrode 5, this separation is more reliably prevented from extending to the outside beyond the vicinity of the peripheral structure 7.

The distances between the portions 7a and 7b may be less than or equal to the thickness of the peripheral structure 7. This increases the aspect ratios of recesses formed by the portions 7a and 7b of the peripheral structure 7. Thus, the surface protective film 6 is more firmly fixed to the recesses. Accordingly, even if the surface protective film 6 starts to be separated from the civility of the utter peripheral edge of the front surface electrode 5, this separation is more reliably prevented from extending to the outside beyond the vicinity of the peripheral structure 7.

In the case where the peripheral structure 7 includes the plurality of communicating regions (deficient regions of the peripheral structure) in FIG. 6, the intervals therebetween may be greater than or equal to the thickness of the peripheral structure. In that case, sufficient adhesion of the epitaxial substrate 30 and the peripheral structure 7 is readily secured. This prevents the separation of the peripheral structure 7 from the epitaxial substrate 30.

It is preferable that the aforementioned communicating regions are not provided in the vicinity of the corners where the front surface electrode 5 has a curvature in plan view and at which the separation of the surface protective film 6 readily occurs particularly.

Embodiment 2

Configuration

Figure 7:
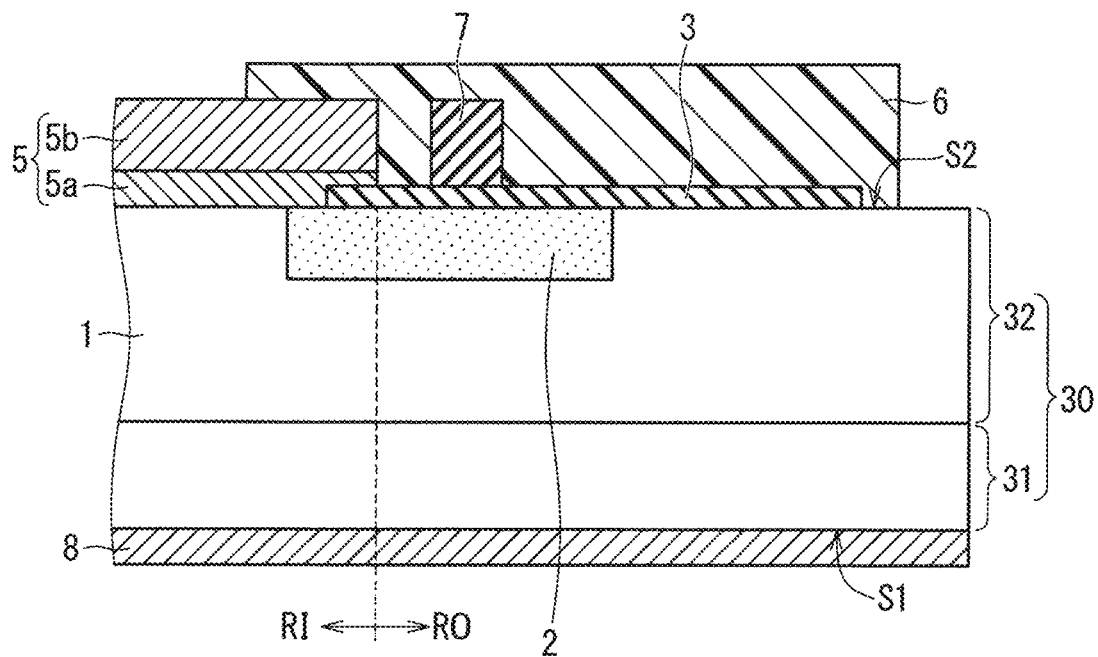
FIG. 7 is a partial sectional view schematically illustrating a configuration of an SBD as an example of a semiconductor device according to Embodiment 2 of the present invention.

FIG. 7 is a partial sectional view schematically illustrating a configuration of an SBD 200 (semiconductor device) according to Embodiment 2 of the present invention. The SBD 200 includes a field insulating film 3. In the present embodiment, the field insulating film 3 is provided on a front surface S2 of an epitaxial substrate 30, spanning an inner region RI and an outer region RO of the epitaxial substrate 30. Thus, the field insulating film 3 has a portion arranged on the outer region RO. The outer peripheral edge (right edge in the drawing) of a peripheral structure 7 is located inward (leftward in the drawing) of the outer peripheral edge (right edge in the drawing) of a terminal well region 2. Thus, the peripheral structure 7 is arranged on the terminal well region 2 via the field insulating film 3. The edge of a front surface electrode 5 is located on the front surface S2 of the epitaxial substrate 30 via the field insulating film 3. The peripheral structure 7 is located on the field insulating film 3. At least either (in the drawing, both) of a Schottky electrode 5a and an electrode pad 5b extends onto the field insulating film 3. The field insulating film 3 is made of an insulating material such as $SiO_2$ or SiN and preferably has a thickness greater than or equal to 10 nm. For example, the field insulating film 3 is an $SiO_2$ film with a thickness of 1 µm.

The configuration other than that described above is substantially the same as the configuration described above in Embodiment 1, and therefore elements that are identical or correspond to those of Embodiment 1 are given the same reference signs and a description thereof shall not be repeated.

Variations

Figure 8:
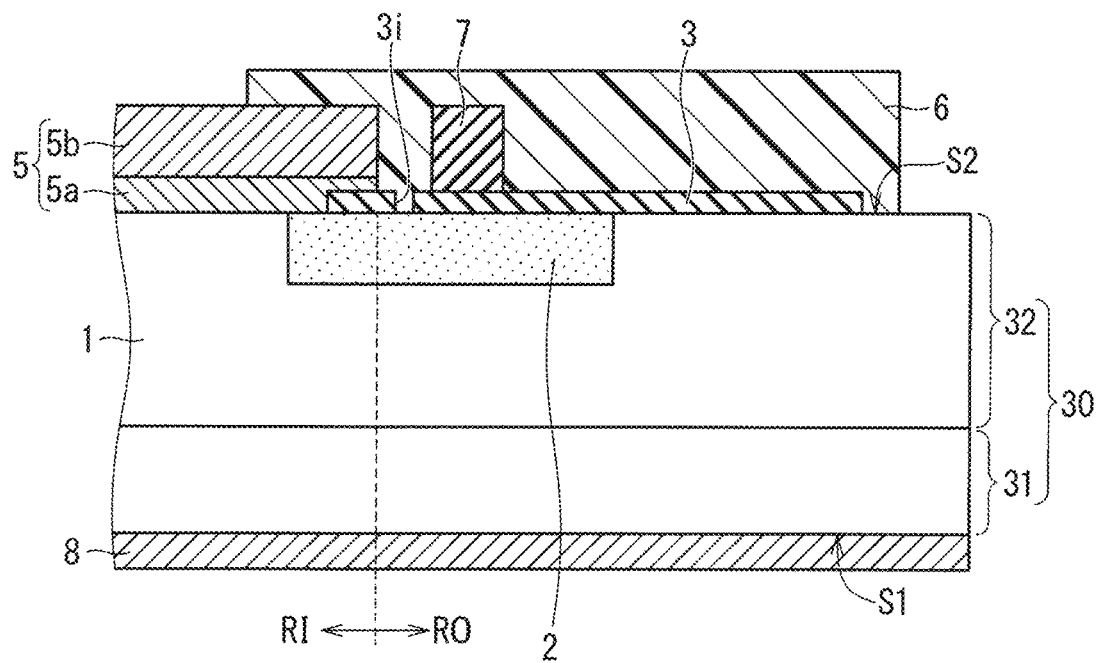
FIG. 8 is a partial sectional view of an SBD as a variation of the semiconductor device according to Embodiment 2 of the present invention.

FIG. 8 is a partial sectional view of an SBD 201 as a first variation of the SBD 200. The field insulating film 3 has an inner opening 3i in which the surface protective film 6 is engaged, between the front surface electrode 5 and the peripheral structure 7. The inner opening 3i preferably has a width less than or equal to the thickness of the field insulating film 3. Note that the inner opening 3i may completely surround the front surface electrode 5 in plan view. Alternatively, a plurality of inner openings 3i spaced from one another may be provide around the front surface electrode 5, and in that case, the inner openings 3i do not completely surround the front surface electrode 5 in plan view.

Figure 9:
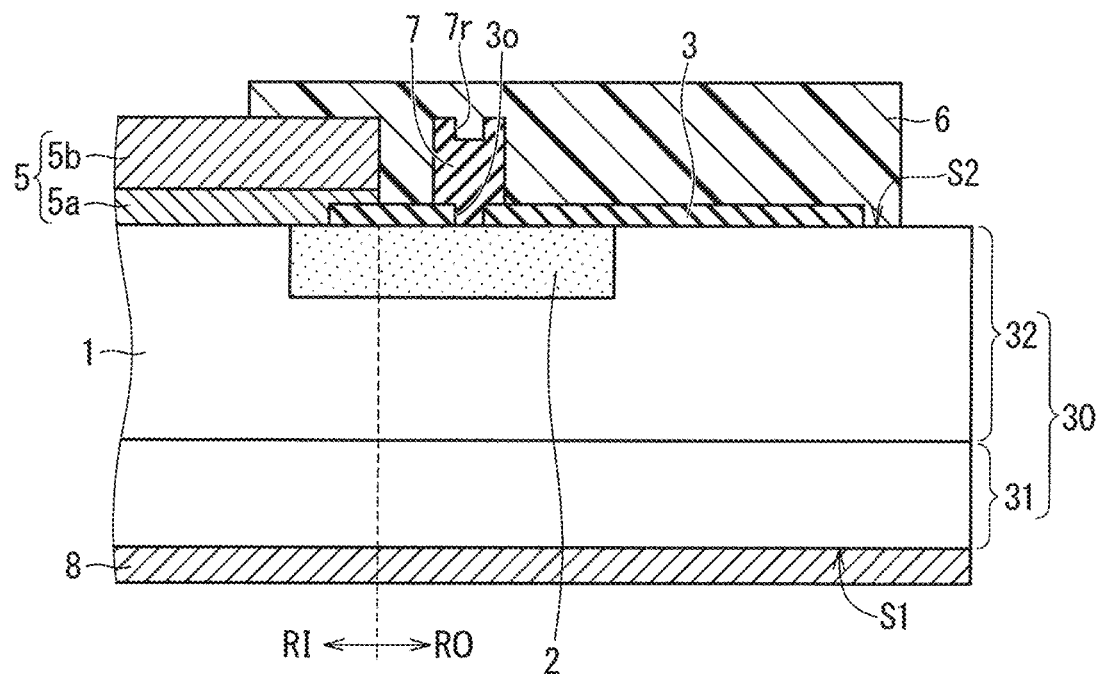
FIG. 9 is a partial sectional view of an SBD as another variation of the semiconductor device according to Embodiment 2 of the present invention.

FIG. 9 is a partial sectional view of an SBD 202 as a second variation of the SBD 200. The field insulating film 3 has an outer opening 3o in which the peripheral structure 7 is engaged. The outer opening 3o preferably has a width less than or equal to the thickness of the field insulating film 3. Note that the outer opening 3o may completely surround the front surface electrode 5 in plan view. Alternatively, a plurality of outer openings 3o spaced from one another may be provided around the front surface electrode 5, and in that case, the outer openings 3o do not completely surround the front surface electrode 5 in plan view.

As another variation, the moisture-resistant insulating film 15 (FIG. 14: variation of Embodiment 1) may be provided. When applied to the present embodiment, the moisture-resistant insulating film 15 is arranged on the outer peripheral edge of the front surface electrode 5, on the peripheral structure 7, and on part of the epitaxial layer 32 via the field insulating film 3. As yet another variation, the peripheral structure 7 may include an outer portion 7o and an inner portion 7i (see the variation of Embodiment 1 illustrated in FIG. 5). As yet another alternative, the peripheral structure 7 may adopt the shape illustrated in FIG. 6 (variation of Embodiment 1). According to these other variations, it is possible to obtain substantially the same effects as those achieved when these variations are applied to Embodiment 1.

Manufacturing Method

Next, an example of a method for manufacturing the SBD 200 according to Embodiment 2 of the present invention will be described. The steps performed up until the formation of the epitaxial substrate 30 including the monocrystalline substrate 31, the drift layer 1, and the terminal well region 2 are the same as those described above in Embodiment 1, and therefore descriptions thereof shall be omitted.

After the aforementioned steps, an $SiO_2$ film with a thickness of 1 μm is deposited by, for example, CVD on the front surface S2 of the epitaxial substrate 30. Thereafter, the field insulating film 3 is formed on part of the front surface S2 through patterning using a photolithographic process and an etching process. The patterning is performed such that the field insulating film 3 spans the boundary between the inner region RI and the outer region RO and extends beyond the edge of the terminal well region 2 in the outer region RO. In the case where the field insulating film 3 has the inner opening 3i (FIG. 8) or the outer opening 3o (FIG. 9) as in the SBD 201 (FIG. 8) or the SBD 202 (FIG. 9) according to the variation, a corresponding photolithographic process is performed.

Next, an $SiO_2$ film with a thickness of 2 μm is deposited by, for example, CVD on the front surface S2 on which the field insulating film 3 is provided. Thereafter, the $SiO_2$ film is patterned by a photolithographic process and an etching process. Accordingly, the peripheral structure 7 is formed on part of the surface of the field insulating film 3 and specifically on part of the surface of the terminal well region 2 via the field insulating film 3. In the case where the peripheral structure 7 includes a plurality of portions spaced from one another as in the SBD 102 (FIG. 5) or the SBD 103 (FIG. 6) described above, a corresponding photolithographic process is performed.

The subsequent steps are the same as those described above in Embodiment 1, and therefore descriptions thereof shall be omitted. In this way, the SBD 200 is obtained.

Operations

Next, operations of the SBD 200 (FIG. 7) will be described below. Note that basic operations regarding the "ON state" and "OFF state" of the SBD 100 described in Embodiment 1 are the same as those of the SBD 200 according to the present embodiment, and therefore descriptions thereof shall be omitted.

Consider a case where the SBD 200 enters the OFF state at high humidity. The surface protective film 6, which has a high water absorbing property, contains a large amount of moisture at high humidity. This moisture reaches the surfaces of the field insulating film 3 and the electrode pad 5b. Thus, as in the case of Embodiment 1, the outer peripheral side of the drift layer 1 acts as an anode and the electrode pad 5b acts as a cathode, and consequently an insulator is deposited on the upper and side faces of the electrode pad 5b. This deposition forces the surface protective film 6 up and may consequently cause separation at the interface between the electrode pad 5b and the surface protective film 6. The separation of the surface protective film 6 may propagate over the field insulating film 3. In other words, the separation may also occur at the interface between the field insulating film 3 and the surface protective film 6. If this separation forms a cavity above the field insulating film 3, an excessive flow leakage current may occur due to intrusion of moisture into the cavity, or a device breakdown of the SBD 200 may be caused by, for example, aerial discharge in the cavity.

According to the present embodiment, the peripheral structure 7 is provided on the field insulating film 3 on the outer peripheral side of the front surface electrode 5. The peripheral structure 7 can thus prevent the separation of the surface protective film 6 from the field insulating film 3, which occurs from the outer peripheral edge of the front surface electrode 5 toward the outer periphery of the drift layer 1.

Summary of Effects

According to Embodiment 2 of the present invention, the peripheral structure 7 is provided on the outer peripheral side of the front surface electrode 5. For substantially the same reason as that of Embodiment 1, the peripheral structure 7 prevents the separation of the surface protective film 6 from the field insulating film 3, which occurs from the outer peripheral edge of the front surface electrode 5 toward the outer periphery of the drift layer 1. Accordingly, the surface protective film 6 can maintain insulation protection in the range from the peripheral structure 7 to the outside. This improves the insulation reliability of the SBD 200.

In general, an electric field inside a semiconductor is readily concentrated in particular in the vicinity of a pn junction. In the present embodiment, an electric field is readily concentrated in the vicinity of the pn junction formed by the drift layer 1 and the terminal well region 2. Thus, on the front surface S2, an electric field is readily concentrated in the vicinity of the outer peripheral edge (right edge in FIG. 7) of the terminal well region 2. This readily forms a high electric field region on the field insulating film 3 around the outer peripheral edge of the terminal well region 2. If the separation of the surface protective film 6 extends to this high electric field region, aerial discharge readily occurs. In the case where the outer peripheral edge (right edge in FIG. 7) of the peripheral structure 7 is located inward (leftward in FIG. 7) of the outer peripheral edge (right edge in FIG. 7) of the terminal well region 2, the separation of the surface protective film 6 is prevented from extending to the above high electric field region. Accordingly, it is possible to avoid a situation where aerial discharge is caused by the above separation.

Referring to FIG. 8, the field insulating film 3 may have the inner opening 3i. This allows the surface protective film 6 to be more firmly fixed to the field insulating film 3 between the front surface electrode 5 and the peripheral structure 7. Accordingly, even if the surface protective film 6 starts to be separated from the vicinity of the outer peripheral edge of the front surface electrode 5, this separation is more reliably prevented from extending to the outside beyond the vicinity of the peripheral structure 7.

The width of the inner opening 3i may be less than or equal to the thickness of the field insulating film 3. This increases the aspect ratio of the inner opening 3i. Thus, the surface protective film 6 is more firmly fixed in the inner opening 3i. Accordingly, even if the surface protective film 6 starts to be separated from the vicinity of the outer peripheral edge of the front surface electrode 5, this separation is more reliably prevented from extending to the outside beyond the vicinity of the peripheral structure 7.

Referring to FIG. 9, the field insulating film 3 may have the outer opening 3o in which the peripheral structure 7 is engaged. Due to the influence of this engagement, the recess 7r is formed in the surface of the peripheral structure 7 that faces the surface protective film 6. As a result of the surface protective film 6 being engaged in this recess 7r, the surface protective film 6 is more firmly fixed to the peripheral structure 7. Accordingly, even if the surface protective film 6 starts to be separated from the vicinity of the outer peripheral edge of the front surface electrode 5, this separation is more reliably prevented from extending to the outside beyond the vicinity of the peripheral structure 7.

The width of the outer opening 3o may be less than or equal to the thickness of the field insulating film 3. This increases the aspect ratio of the recess 7r. Thus, the surface protective film 6 is more firmly fixed in the recess 7r. Accordingly, even if the surface protective film 6 starts to be separated from the vicinity of the outer peripheral edge of the front surface electrode 5, this separation is more reliably prevented from extending to the outside beyond the vicinity of the peripheral structure 7.

Embodiment 3

Configuration

Figure 10:
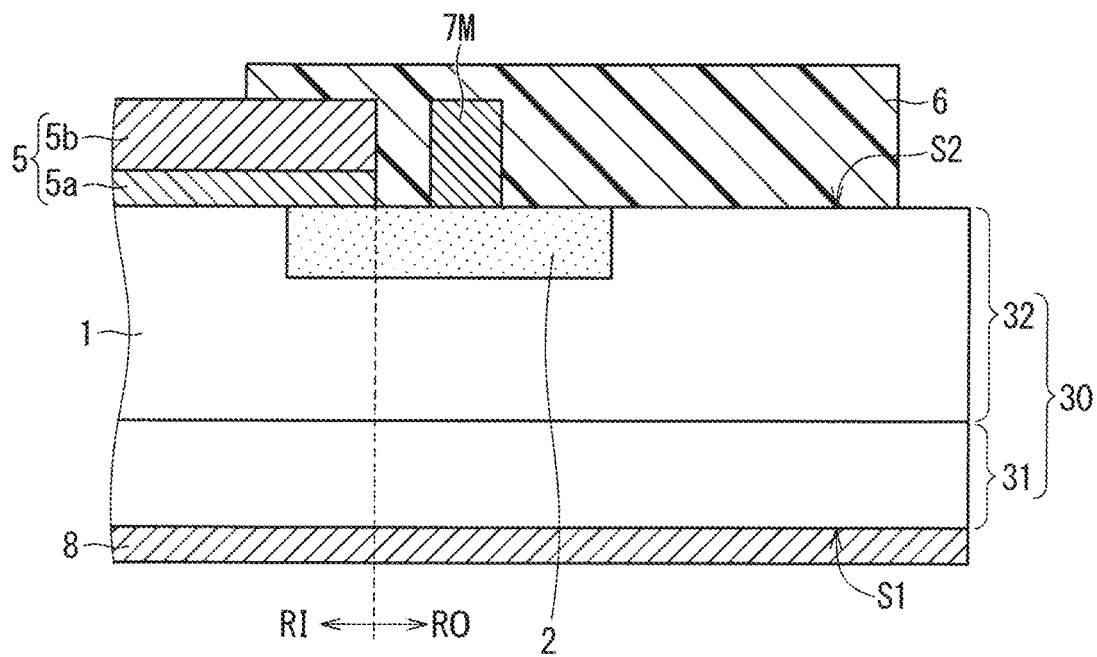
FIG. 10 is a partial sectional view schematically illustrating a configuration of an SBD as an example of a semiconductor device according to Embodiment 3 of the present invention.

FIG. 10 is a partial sectional view schematically illustrating a configuration of an SBD 300 (semiconductor device) according to Embodiment 3 of the present invention. The SBD 300 includes a peripheral structure 7M made of a conductive material, instead of the peripheral structure 7 made of an insulating material (FIG. 1: Embodiment 1). Examples of the conductive material include metals that contain any of Ti, Au, W, Al, Cu, Mo, and Ni, Al alloys such as Al—Si, and semiconducting materials such as polysilicon. The material for the peripheral structure 7M may be the same as the material for at least part of the front surface electrode 5. In other words, the material for the peripheral structure 7M may be the material for the Schottky electrode 5a or the material for the electrode pad 5b. Alternatively, the material for the peripheral structure 7M may be the same as the material for the front surface electrode 5. In other words, the material for the peripheral structure 7M may be a composite material of the material for the Schottky electrode 5a and the material for the electrode pad 5b. In other words, the peripheral structure 7M may have the same laminated structure as the laminated structure of the front surface electrode 5.

The peripheral structure 7M may be arranged in the same manner as the peripheral structure 7 (Embodiment 1). Specifically, the outer peripheral edge (right edge in the drawing) of the peripheral structure 7M is located inward (leftward) of the outer peripheral edge (right edge in the drawing) of the terminal well region 2. Moreover, the peripheral structure 7M is preferably spaced from the maximum depletion layer MDL (FIG. 3).

The other configuration is substantially the same as the configuration described above in Embodiment 1, and therefore elements that are identical or correspond to those of Embodiment 1 are given the same reference signs and descriptions thereof shall not be repeated.

Variations

Figure 11:
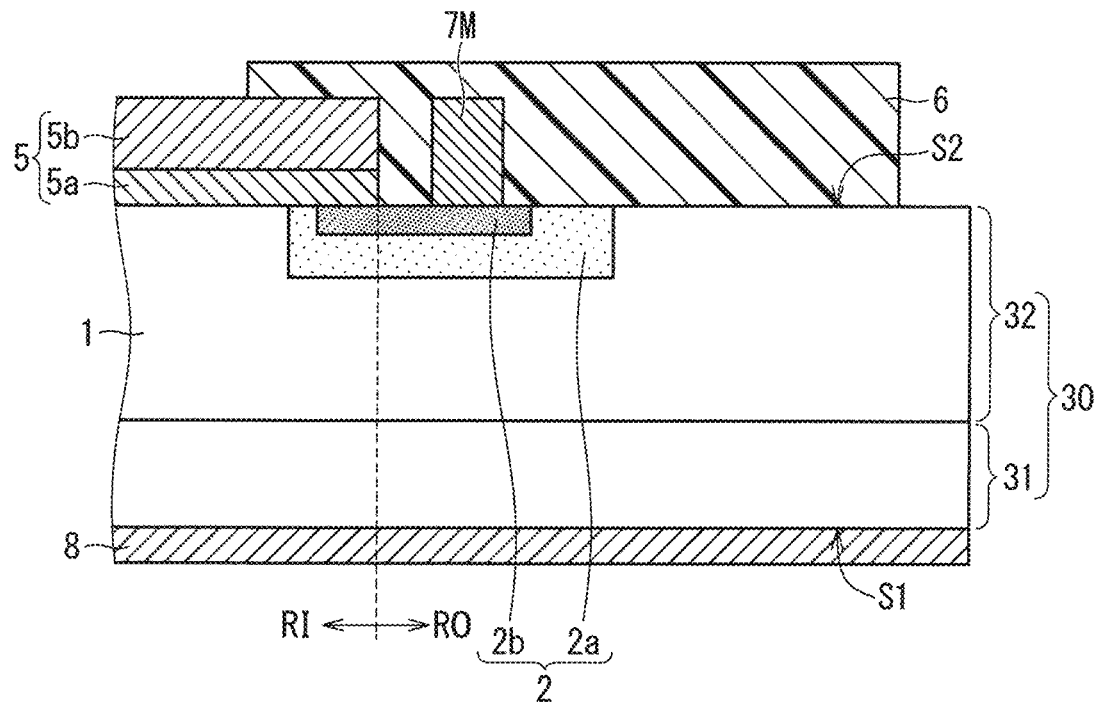
FIG. 11 is a partial sectional view of an SBD as a variation of the semiconductor device according to Embodiment 3 of the present invention.

FIG. 11 is a partial sectional view of an SBD 301 as a variation of the SBD 300. In the SBD 301, the terminal well region 2 contains a low concentration portion 2a (first portion) and a high concentration portion 2b (second portion) that has a higher impurity concentration than the impurity concentration of the low concentration portion 2a in the front surface S2 of the epitaxial substrate 30. As illustrated, the high concentration portion 2b may be isolated from the drift layer 1 by the low concentration portion 2a. Alternatively, the high concentration portion 2b may reach the drift layer 1 in the depth direction. In other words, the high concentration portion 2b may be formed deeper than the low concentration portion 2a. The Schottky electrode 5a may or may not be connected to the high concentration portion 2b. The high concentration portion 2b may include a plurality of portions spaced from one another. The outer peripheral edge (right edge in the drawing) of the peripheral structure 7M is preferably located inward of the outer peripheral edge (right edge in the drawing) of the high concentration portion 2b.

Moreover, the variations of Embodiment 1 may be applied to Embodiment 3 of the present invention. In that case, substantially the same effects as those of Embodiment 1 can be achieved.

Manufacturing Method

Next, an example of a method for manufacturing the SBD 300 according to Embodiment 3 of the present invention will be described. The steps performed up until the formation of the epitaxial substrate 30 including the monocrystalline substrate 31, the drift layer 1, and the terminal well region 2 are the same as those described above in Embodiment 1, and therefore descriptions thereof shall be omitted. In the case of manufacturing the SBD 301 (FIG. 11) according to the variation, a photolithographic process and ion implantation may be performed for the low concentration portion 2a, and a photolithographic process and ion implantation may be performed for the high concentration portion 2b.

After the aforementioned steps, the material for the Schottky electrode 5a and the material for the electrode pad are deposited in this order by, for example, sputtering on the entire front surface S2. For example, a Ti film with a thickness of 100 nm and an Al film with a thickness of 3 μm are deposited in this order. Next, the Schottky electrode 5a and the electrode pad 5b of desired shapes are formed through patterning using a photolithographic process and an etching process. Dry etching or wet etching can be used to etch the metal films. As an etchant in the wet etching, a hydrofluoric acid (HF)-based or phosphoric acid-based etchant is used, for example. Note that the patterning of the Schottky electrode 5a and the patterning of the electrode pad 5b may be performed separately. In this case, a resultant structure may be such that the outer peripheral edge of the electrode pad 5b juts out the outer peripheral edge of the Schottky electrode 5a so that the electrode pad 5b completely covers the Schottky electrode 5a. Alternatively, a resultant structure may be such that the outer peripheral edge of the Schottky electrode 5a juts out the outer peripheral edge of the electrode pad 5b so that part of the Schottky electrode 5a is not covered with the electrode pad 5b. The distance between the electrode pad 5b and the peripheral structure 7M is preferably less than or equal to a total thickness of the Schottky electrode 5a and the electrode pad 5b (in the example using the above dimensions, 3.0+0.1=3.1 μm) or preferably less than or equal to the thickness of the peripheral structure 7M (in an example described below, 3.1 μm, i.e., the same as the above total thickness).

The peripheral structure 7M is preferably formed simultaneously in the step of patterning both of the Schottky electrode 5a and the electrode pad 5b or in the step of patterning either of them. For example, the peripheral structure 7M is formed simultaneously in the step of patterning both of the Schottky electrode 5a and the electrode pad 5b, and in that case, the peripheral structure 7M has the same layer structure as that of the front surface electrode 5. In the example case using the above dimensions, the peripheral structure 7M has a two-layer structure including a Ti film with a thickness of 100 nm and an Al film with a thickness of 3 μm.

As a variation, the moisture-resistant insulating film 15 (see FIG. 4) may be formed as in the case of Embodiment 1 described above. The method of formation is the same as that of Embodiment 1, and therefore a description thereof shall be omitted.

Next, the surface protective film 6 is formed so as to cover the outer peripheral edge of the electrode pad 5b and the front surface S2 on which the peripheral structure 7M is provided. For example, the surface protective film 6 may be formed into a desired shape by applying and exposing a coating of photosensitive polyimide.

Then, the rear surface electrode 8 is formed by, for example, sputtering on the rear surface S1 of the epitaxial substrate 30. Note that the timing of formation of the rear surface electrode 8 may be prior to the above timing.

In this way, the SBD 300 is obtained.

Operations Next, operations of the SBD 300 (FIG. 10) will be described below. Note that basic operations regarding the "ON state" and "OFF state" of the SBD 100 described in Embodiment 1 are the same as those of the SBD 300 according to the present embodiment, and therefore descriptions thereof shall be omitted.

Unlike Embodiment 1, Embodiment 3 of the present invention uses the peripheral structure 7M made of a conductive material, instead of the peripheral structure 7 made of an insulating material (FIG. 1). The peripheral structure 7M made of a conductive material is electrically connected to the front surface electrode 5 via the terminal well region 2. Here, the terminal well region 2 has a higher resistivity than the resistivities of the front surface electrode 5 and the peripheral structure 7M. Thus, the peripheral structure 7M has a higher potential than the potential of the front surface electrode 5 in the OFF state due to the electrical resistance of the terminal well region 2. Thus, the front surface electrode 5 rather than the peripheral structure 7M principally acts as a cathode that involves generation of OH⁻ ions. Accordingly, an insulator arising from the generation of OH⁻ ions is not deposited on the upper and side faces of the peripheral structure 7M. This avoids the surface protective film 6 from being separated from the peripheral structure 7M due to this deposit. Accordingly, like the peripheral structure 7 (FIG. 1: Embodiment 1), the peripheral structure 7M has a function of stopping the separation of the surface protective film 6 from the field insulating film 3, which occurs from the outer peripheral edge of the front surface electrode 5 toward the outer periphery of the drift layer 1.

In the OFF state, a depletion layer expands from the pn junction formed by the drift layer 1 and the terminal well region 2 to the insides of the drift layer 1 and the terminal well region 2. If the applied voltage is increased up to a limit, a maximum depletion layer MDL (see FIG. 3) is formed. Since the depletion layer has a potential gradient, if the depletion layer in the surface of the terminal well region 2 reaches the outer peripheral edge of the conductive peripheral structure 7M, a large potential difference occurs at the outer peripheral edge (right edge in the drawing) of the peripheral structure 7M. Then, due to a resultant excessive electric field concentration, a breakdown may occur at the outer peripheral edge of the peripheral structure 7M. Therefore, the peripheral structure 7M is preferably arranged away from the maximum depletion layer MDL (FIG. 3).

Summary of Effects

According to Embodiment 3 of the present invention, the peripheral structure 7M is provided on the outer peripheral side of the front surface electrode 5. Thus, for substantially the same reason as that of Embodiment 1, the peripheral structure 7 can prevent the separation of the surface protective film 6 from the field insulating film 3, which occurs from the outer peripheral edge of the front surface electrode 5 toward the outer periphery of the drift layer 1. Accordingly, the surface protective film 6 can maintain insulation protection in the range from the peripheral structure 7M to the outside. This improves the insulation reliability of the SBD 300.

The peripheral structure 7M is made of a conductive material. Thus, a material other than a non-conductive material can be selected as the material for the peripheral structure 7M. In general, conductive materials are readily deposited to a greater thickness than insulating materials such as $SiO_2$. In order for the peripheral structure 7M to achieve sufficient effects, the peripheral structure 7M needs to have a certain degree or more of thickness. The use of a conductive material makes it easy to form a thick peripheral structure 7M.

Preferably, the material for the peripheral structure 7M is the same as the material for at least part of the front surface electrode 5. This allows the step of forming the peripheral structure 7M and at least part of the step of forming the front surface electrode 5 to be integrated into a common step. Also, the material for the peripheral structure 7M may be the same as the material for the front surface electrode 5. This allows the step of forming the peripheral structure 7M and the step of forming the front surface electrode 5 to be integrated into a common step.

The outer peripheral edge of the peripheral structure 7M is located inward of the outer peripheral edge of the terminal well region 2. This avoids a situation where the peripheral structure 7M causes a short circuit in the pn junction formed by the drift layer 1 and the terminal well region 2. This also suppresses the concentration of an electric field at the outer peripheral edge of the peripheral structure 7M.

The peripheral structure 7M is preferably located away from the maximum depletion layer MDL (see FIG. 3). This more reliably suppresses the concentration of an electric field at the outer peripheral edge of the peripheral structure 7M.

Referring to FIG. 11, the outer peripheral edge of the peripheral structure 7M may be located inward of the outer peripheral edge of the high concentration portion 2b of the terminal well region 2. This makes it difficult for the depletion layer, which expands from the pn junction between the drift layer 1 and the terminal well region 2 to the inside of the terminal well region 2 in the OFF state, to reach the outer peripheral edge of the peripheral structure 7M. Accordingly, it is possible to more reliably suppress the concentration of an electric field at the outer peripheral edge of the peripheral structure 7M.

Note that the expansion of the depletion layer from the pn junction formed by the drift layer 1 and the terminal well region 2 varies depending on the concentrations and thicknesses of the drift layer 1 and the terminal well region 2 and the voltage applied to the SBD (semiconductor device), and can be calculated through a device simulation using a technology computer aided design (TCAD).

Embodiment 4

Configuration

Figure 12:
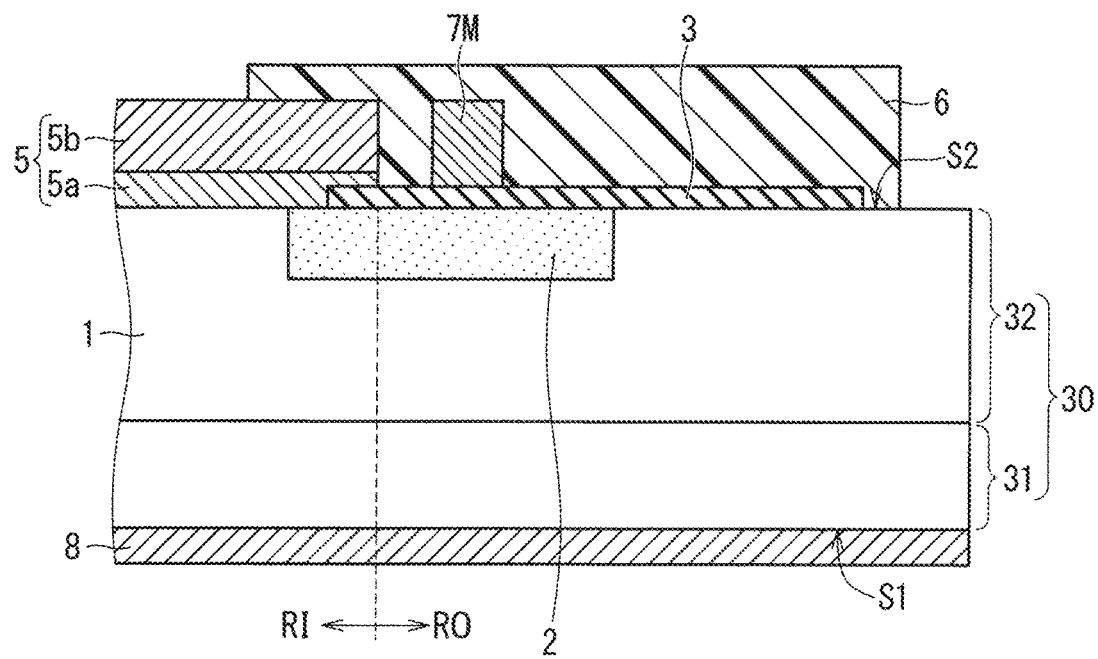
FIG. 12 is a partial sectional view schematically illustrating a configuration of an SBD as an example of a semiconductor device according to Embodiment 4 of the present invention.

FIG. 12 is a partial sectional view schematically illustrating a configuration of an SBD 400 (semiconductor device) according to Embodiment 4 of the present invention. The SBD 400 includes a field insulating film 3 that is substantially the same as that of Embodiment 2. The other configuration is substantially the same as the configuration of Embodiment 3 (FIG. 10) described above. Thus, in the present embodiment, the peripheral structure 7M is arranged on the outer region RO of the epitaxial substrate 30 via the field insulating film 3. The peripheral structure 7M is preferably spaced from a region where the maximum depletion layer MDL (FIG. 3) reaches the front surface S2, in an in-plane direction (lateral direction in the drawing).

Note that the configuration other than that described above is substantially the same as the configuration of Embodiment 3d described above, and therefore elements that are identical or correspond to those of Embodiment 3 are given the same reference signs and descriptions thereof shall not be repeated.

Variations

Figure 13:
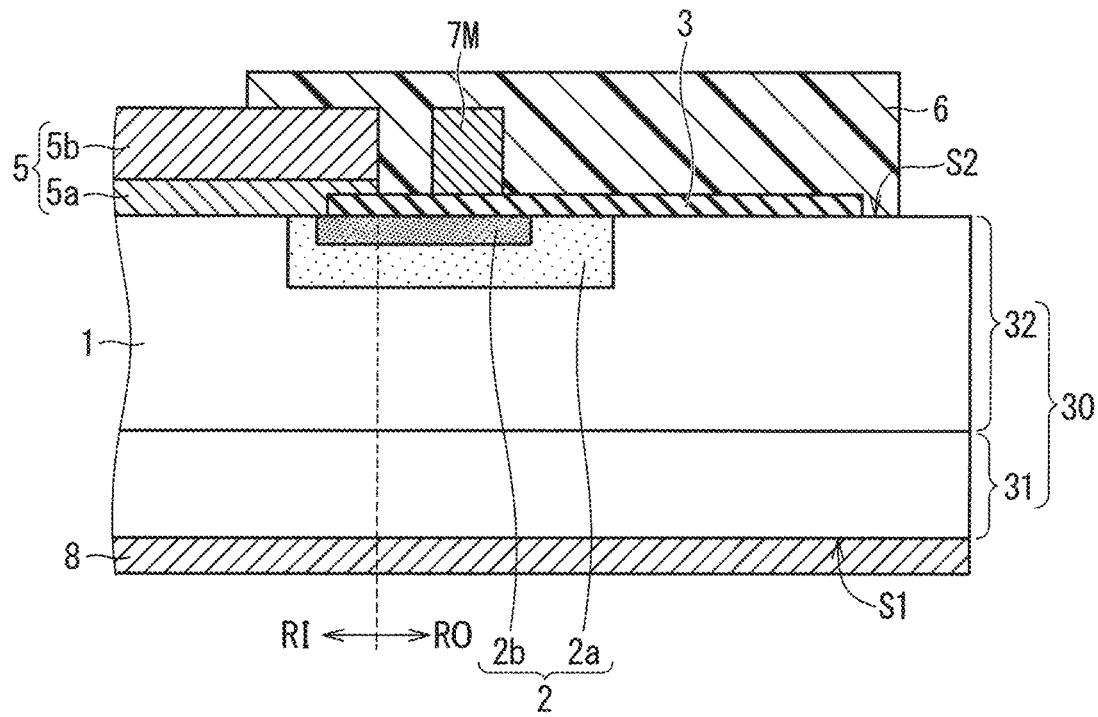
FIG. 13 is a partial sectional view of an SBD as a variation of the semiconductor device according to Embodiment 4 of the present invention.

FIG. 13 is a partial sectional view of an SBD 401 as a first variation of the SBD 400. In the SBD 401, the terminal well region 2 includes a low concentration portion 2a and a high concentration portion 2b as in the SBD 301 (FIG. 11: variation of Embodiment 3). The outer peripheral edge (right edge in the drawing) of the peripheral structure 7M is located inward (leftward in the drawing) of the outer peripheral edge (right edge in the drawing) of the high concentration portion 2b. The Schottky electrode 5a may or may not be connected to the high concentration portion 2b.

Figure 14:
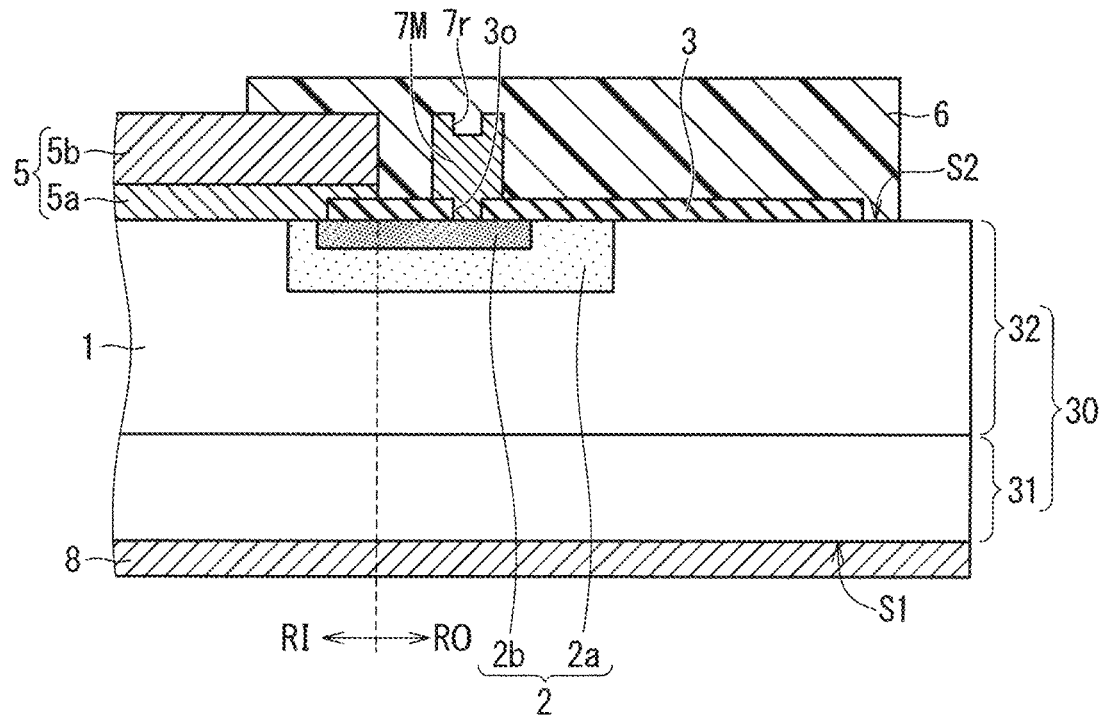
FIG. 14 is a partial sectional view of an SBD as another variation of the semiconductor device according to Embodiment 4 of the present invention.

FIG. 14 is a partial sectional view of an SBD 402 as a second variation of the SBD 400. In the SBD 402, the field insulating film 3 has an outer opening 3o as in the SBD 202 (FIG. 9: variation of Embodiment 3). According to this variation, the peripheral structure 7M is engaged in the outer opening 3o. Thus, the terminal well region 2 is electrically connected to the peripheral structure 7M. Preferably, the outer peripheral edge (right edge in the drawing) of the outer opening 3o is located inward (leftward) of the outer peripheral edge (right edge in the drawing) of the high concentration portion 2b of the terminal well region 2. This condition is satisfied as a natural result of the outer peripheral edge of the peripheral structure 7M being located inward of the outer peripheral edge of the high concentration portion 2b of the terminal well region 2.

As another variation, the moisture-resistant insulating film 15 (FIG. 4: variation of Embodiment 1) may be provided. When applied to the present embodiment, the moisture-resistant insulating film 15 is arranged on the outer peripheral edge of the front surface electrode 5, on the peripheral structure 7M, and on part of the epitaxial layer 32 via the field insulating film 3. As yet another variation, the peripheral structure 7M may include an outer portion and an inner portion, like the peripheral structure 7 including the outer portion 7o and the inner portion 7i (see the variation of Embodiment 1 illustrated in FIG. 5). As yet another variation, the peripheral structure 7M may adopt the same shape as that of the peripheral structure 7 illustrated in FIG. 6 (variation of Embodiment 1). According to these other variations, it is possible to obtain substantially the same effects as those achieved when these variations are applied to Embodiment 1.

Manufacturing Method

Next, an example of a method for manufacturing the SBD 400 according to Embodiment 4 of the present invention will be described.

First, the steps performed up until the formation of the field insulating film 3 are performed by substantially the same method as the that of Embodiment 2 described above. In the case of manufacturing the SBD 401 (FIG. 13) or the SBD 402 (FIG. 14) according to the variation, a photolithographic process and ion implantation may be performed for the low concentration portion 2a, and a photolithographic process and ion implantation may be performed for the high concentration portion 2b.

Next, the front surface electrode 5 and the peripheral structure 7M are formed by substantially the same method as that of Embodiment 3 described above. Here, as a variation, the moisture-resistant insulating film 15 (see FIG. 4) may be formed as in the case of Embodiment 1 described above. The method of formation is the same as that of Embodiment 1, and therefore a description thereof shall be omitted.

The subsequent steps are substantially the same as those of Embodiment 2 described above, except that the peripheral structure 7 is replaced by the peripheral structure 7M, and therefore a description thereof shall be omitted. In this way, the SBD 400 is obtained.

Operations

Next, operations of the SBD 400 (FIG. 12) will be described below. Note that basic operations regarding the "ON state" and "OFF state" of the SBD 100 described in Embodiment 1 are the same as those of the SBD 400 according to the present embodiment, and therefore descriptions thereof shall be omitted.

Consider a case where the SBD 400 enters the OFF state at high humidity. The surface protective film 6, which has a high water absorbing property, contains a large amount of moisture at high humidity. This moisture reaches the surfaces of the field insulating film 3 and the electrode pad 5b. Thus, as in the case of Embodiment 1, the outer peripheral side of the drift layer 1 acts as an anode and the electrode pad 5b acts as a cathode, and consequently an insulator is deposited on the upper and side faces of the electrode pad 5b. This deposition forces the surface protective film 6 up and may consequently cause separation at the interface between the electrode pad 5b and the surface protective film 6. The separation of the surface protective film 6 may propagate over the field insulating film 3. In other words, the separation may also occur at the interface between the field insulating film 3 and the surface protective film 6. If this separation forms a cavity above the field insulating film 3, an excessive flow of leakage current may occur due to instruction of moisture into the cavity, or a device breakdown of the SBD 400 may be caused by, for example, aerial discharge in the cavity.

According to the present embodiment, the peripheral structure 7M is provided on the field insulating film 3 on the outer peripheral side of the front surface electrode 5. The peripheral structure 7M can thus prevent the separation of the surface protective film 6 from the field insulating film 3, which occurs from the outer peripheral edge of the front surface electrode 5 toward the outer periphery of the drift layer 1.

Like the SBD 200 (FIG. 7: Embodiment 2), the SBD 400 (FIG. 12) according to the present embodiment includes the field insulating film 3. On the other hand, unlike Embodiment 2, Embodiment 4 of the present invention uses the peripheral structure 7M made of a conductive material, instead of the peripheral structure 7 made of an insulating material (FIG. 1). In the SBD 400 (FIG. 12) and the SBD 401 (FIG. 13), the peripheral structure 7M is present on the field insulating film 3. Thus, in the OFF state, the peripheral structure 7M has an intermediate potential between the potential of the front surface electrode 5 serving as a cathode and the potential of the outer peripheral side of the epitaxial layer 32 serving as an anode. In the SBD 402 (FIG. 14), the peripheral structure 7M made of a conductive material is electrically connected to the front surface electrode 5 via the terminal well region 2. Here, the terminal well region 2 has a higher resistivity than the resistivities of the front surface electrode 5 and the peripheral structure 7M. Thus, the peripheral structure 7M has a higher potential than the potential of the front surface electrode 5 in the OFF state due to the electrical resistance of the terminal well region 2. Accordingly, the front surface electrode 5 rather than the peripheral structure 7M primarily acts as an cathode that involves generation of OH⁻ ions.

Accordingly, an insulator arising from the generation of OH⁻ ions is not deposited on the upper and side faces of the peripheral structure 7M. This avoids the surface protective film 6 from being separated from the peripheral structure 7M due to this deposit. Accordingly, like the peripheral structure 7 (FIG. 7: Embodiment 2), the peripheral structure 7M has a function of stopping the separation of the surface protective film 6 from the field insulating film 3, which occurs from the outer peripheral edge of the front surface electrode 5 toward the outer periphery of the drift layer 1.

In the OFF state, a depletion layer expands from the pn junction formed by the drift layer 1 and the terminal well region 2 to the insides of the drift layer 1 and the terminal well region 2. If the applied voltage is increased up to a limit, a maximum depletion layer MDL (see FIG. 3) is formed. Since the depletion layer has a potential gradient, if the depletion layer in the surface of the terminal well region 2 reaches the outer peripheral edge of the conductive peripheral structure 7M, a large potential difference occurs at the outer peripheral edge (right edge in the drawing) of the peripheral structure 7M. Then, due to a resultant excessive electric field concentration, a breakdown may occur at the outer peripheral edge of the peripheral structure 7M. Therefore, the peripheral structure 7M is preferably arranged away from the maximum depletion layer MDL (FIG. 3).

Even if the depletion layer expands little from the pn junction between the drift layer 1 and the terminal well region 2 to the inside of the terminal well region 2 resulting from the sufficiently high concentration of the terminal well region 2, the depletion layer expands greatly from the pn junction toward the drift layer 1. Therefore, the outer peripheral edge of the peripheral structure 7M is preferably located inward of the outer peripheral edge of the terminal well region 2.

A method for relieving an electric field by providing one or more wells that are electrically in a floating state outside the terminal well region 2 is generally known. In the OFF state, a depletion layer expands between the terminal well region 2 and the wells that are in a floating state as described above. Thus, even in this case, the outer peripheral edge of the peripheral structure 7M is preferably located inward of the outer peripheral edge of the terminal well region 2.

Summary of Effects

According to Embodiment 4 of the present invention, the peripheral structure 7M is provided on the outer peripheral side of the front surface electrode 5. Thus, for substantially the same reason as that of Embodiment 1, the peripheral structure 7M can prevent the separation of the surface protective film 6 from the field insulating film 3, which occurs from the outer peripheral edge of the front surface electrode 5 toward the outer periphery of the drift layer 1. Accordingly, the surface protective film 6 can maintain insulation protection in the range from the peripheral structure 7M to the outside. This improves the insulation reliability of the SBD 400.

The outer peripheral edge (right edge in FIG. 12) of the peripheral structure 7M is located inward (leftward in FIG. 12) of the outer peripheral edge (right edge in FIG. 12) of the terminal well region 2. This suppresses the concentration of an electric field at the outer peripheral edge of the peripheral structure 7M.

Referring to FIG. 13, the outer peripheral edge of the peripheral structure 7M may be located inward of the outer peripheral edge of the high concentration portion 2b of the terminal well region 2. This makes it difficult for the depletion layer, which expands from the pn junction between the drift layer 1 and the terminal well region 2 to the inside of the terminal well region 2 in the OFF state, from reaching the outer peripheral edge of the peripheral structure 7M. Accordingly, it is possible to more reliably suppress the concentration of an electric field at the outer peripheral edge of the peripheral structure 7M.

Referring to FIG. 14, the field insulating film 3 may have the outer opening 3o in which the peripheral structure 7M is engaged. Due to the influence of this engagement, the recess 7r is formed in the surface of the peripheral structure 7M that faces the surface protective film 6. As a result of the surface protective film 6 being engaged in the recess 7r, the surface protective film 6 is more firmly fixed to the peripheral structure 7M. Accordingly, even if the surface protective film 6 starts to be separated from the vicinity of the outer peripheral edge of the front surface electrode 5, this separation is more reliably prevented from extending to the outside beyond the vicinity of the peripheral structure 7M.

The width of the outer opening 3o may be less than or equal to the thickness of the field insulating film 3. This increases the aspect ratio of the recess 7r. Thus, the surface protective film 6 is more firmly fixed in the recess 7r. Accordingly, even if the surface protective film 6 starts to be separated from the vicinity of the outer peripheral edge of the front surface electrode 5, this separation is more reliably prevented from extending to the outside beyond the vicinity of the peripheral structure 7M.

Embodiment 5

Configuration

Figure 15:
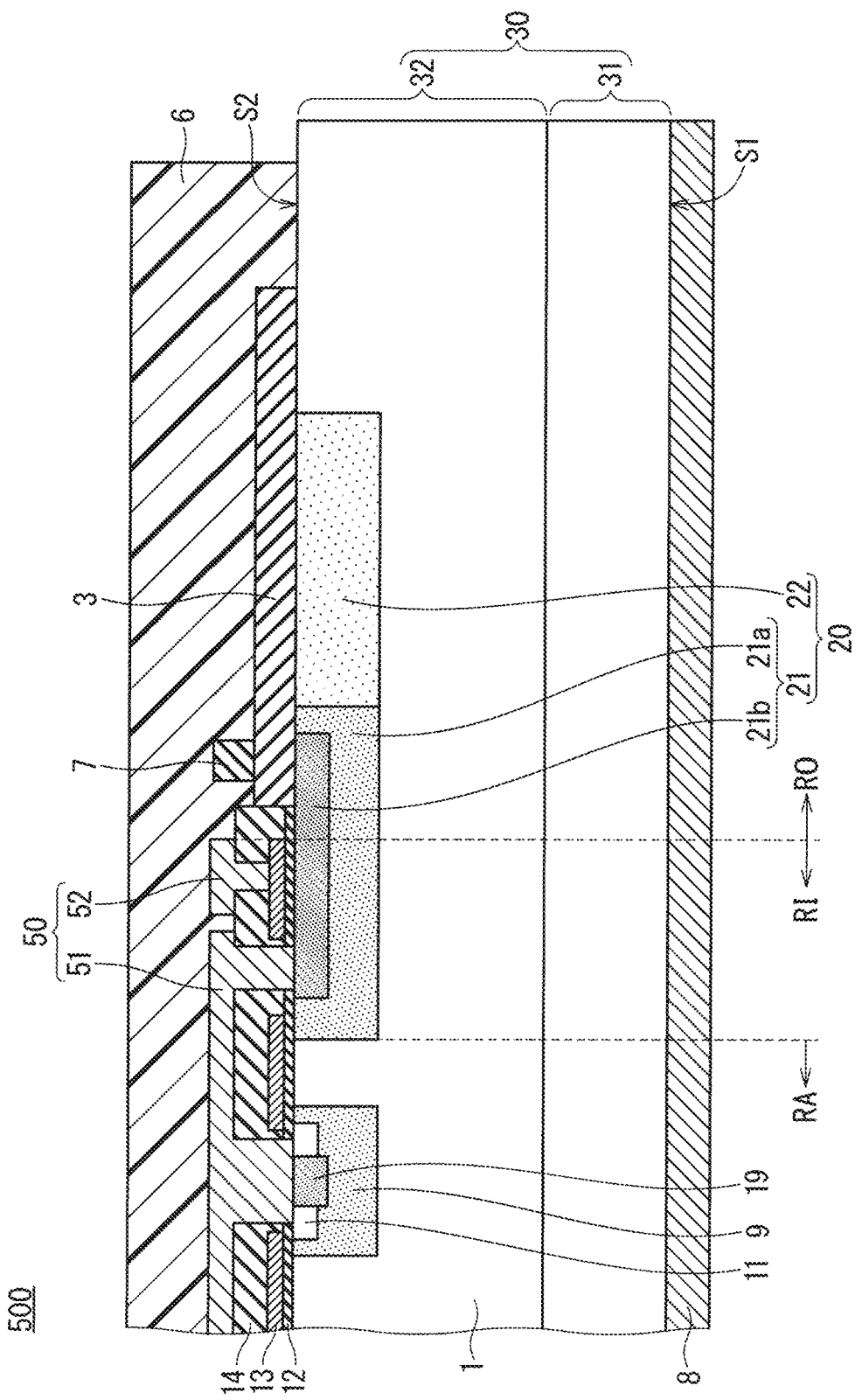
FIG. 15 is a partial sectional view taken along line XV-XV in FIG. 16 and schematically illustrating a configuration of an MOSFET as an example of a semiconductor device according to Embodiment 5 of the present invention.
Figure 16:
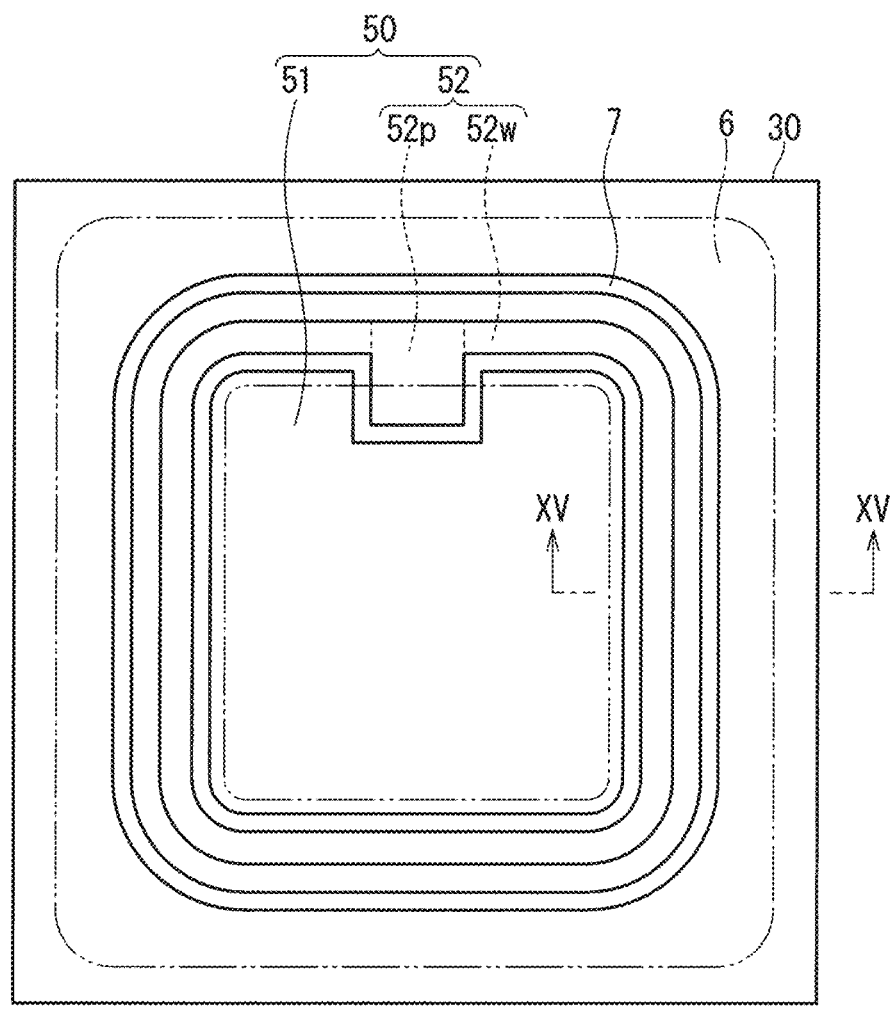
FIG. 16 is a top view schematically illustrating the configuration of the MOSFET as an example of the semiconductor device according to Embodiment 5 of the present invention.
Figure 17:
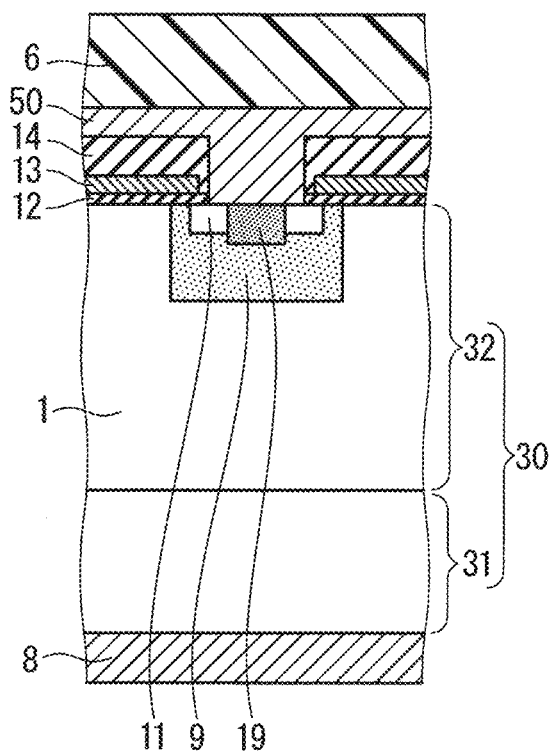
FIG. 17 is a partial sectional view schematically illustrating a configuration of a unit cell included in the configuration illustrated in FIG. 15.

FIG. 15 is a partial sectional view taken along line XV-XV in FIG. 16 and schematically illustrating a configuration of an MOSFET 500 (semiconductor device) according to Embodiment 5. FIG. 16 is a top view schematically illustrating the configuration of the MOSFET 500. FIG. 17 is a partial sectional view schematically illustrating a configuration of a unit cell UC included in the configuration illustrated in FIG. 15. In FIG. 15, the right side corresponds to the termination side of the MOSFET 500, and the left side corresponds to the active-region side on which principal current flows in an ON state.

The MOSFET 500 includes an epitaxial substrate 30, a rear surface electrode 8 (drain electrode), a front surface electrode 50 (second electrode). a peripheral structure 7, a surface protective film 6, and a field insulating film 3. The MOSFET 500 also includes a gate insulating film 12, a gate electrode 13, and an interlayer insulating film 14.

In the present embodiment, the epitaxial substrate 30 is made of polytype 4H SiC. Thus, the MOSFET 500 is an SiC-MOSFET. The epitaxial substrate 30 has a rear surface S1 and a front surface S2. The front surface S2 includes an inner region RI and an outer region RO located outside the inner region. The epitaxial substrate 30 includes a monocrystalline substrate 31 forming the rear surface S1, and an epitaxial layer 32 arranged on the monocrystalline substrate 31 and forming the front surface S2.

In the present embodiment, the epitaxial layer 32 includes a drift layer 1, a terminal well region 20, terminal well regions 9, contact regions 19, and source regions 11. The source regions 11 are of the same conductivity type as the conductivity type of the drift layer 1. The drift layer 1 according to the present embodiment is of the same conductivity type as the conductivity type of the monocrystalline substrate 31 and is specifically of an n-type (first conductivity type). The terminal well region 20, the element well regions 9, and the contact regions 19 are of a p-type (second conductivity type different from the first conductivity type). The terminal well region 20 is isolated from the monocrystalline substrate 31 by the drift layer 1. In other words, the terminal well region 20 is formed in a surface portion of the epitaxial layer 32. The drift layer 1 has a lower impurity concentration than the impurity concentration of the monocrystalline substrate 31. Thus, the monocrystalline substrate 31 has a lower resistivity than the resistivity of the drift layer 1. The impurity concentration of the drift layer 1 is higher than or equal to $1 \times 10^{14}/cm^3$ and lower than or equal to $1 \times 10^{17}/cm^3$. In the front surface S2, the terminal well region 20 includes a portion that extends from between the inner region RI and the outer region RO toward the outer region RO. In other words, the terminal well region 20 spans the boundary between the inner region RI and the outer region RO.

The terminal well region 20 includes a boundary portion 21 that extends from the boundary between the inner region RI and the outer region RO. As illustrated in FIG. 15, the boundary portion 21 includes a portion that extends inward (leftward in the drawing) from the boundary between the inner region RI and the outer region RO. The boundary portion 21 may be formed to surround an active region RA. In the front surface S2, the boundary portion 21 includes a low concentration portion 21a (first portion) and a high concentration portion 21b (second portion) having a higher impurity concentration than the impurity concentration of the low concentration portion 21a. The terminal well region 20 includes an extension portion 22 that further extends outward from the boundary portion 21.

The front surface electrode 50 is provided on part of the inner region RI of the epitaxial substrate 30. The front surface electrode 50 includes a source electrode 51 (main electrode portion) and a gate line electrode 52 (control line electrode portion). The source electrode 51 of the front surface electrode 50 is electrically connected to the boundary portion 21 of the terminal well region 20. The gate line electrode 52 is configured to receive a gate signal (control signal) for controlling an electrical path between the source electrode 51 and the rear surface electrode 8, and is spaced from the source electrode 51. The front surface electrode 50 has its edge on the boundary between the inner region RI and the outer region RO, and in the section illustrated in FIG. 15, the gate line electrode 52 has its edge on the aforementioned boundary. The gate line electrode 52 includes a gate pad 52p and a gate line 52w (FIG. 16).

The field insulating film 3 includes a portion arranged on the outer region RO of the front surface S2 of the epitaxial substrate 30. The field insulating film 3 covers the extension portion 22 of the terminal well region 20. The field insulating film 3 has an opening above the inner region RI. In the present embodiment, the outer peripheral edge of the interlayer insulating film 14 is linked to the inner peripheral edge of the field insulating film 3. The interlayer insulating film 14 is provided on the front surface S2 of the epitaxial substrate 30, spanning the inner region RI and the outer region RO of the epitaxial substrate 30. The edge of the front surface electrode 50 is located on the front surface S2 of the epitaxial substrate 30 via the interlayer insulating film 14. In other words, the front surface electrode 50 extends onto the interlayer insulating film 14.

The peripheral structure 7 is provided on part of the outer region RO of the epitaxial substrate 30, away from the front surface electrode 50. In the present embodiment, the peripheral structure 7 is arranged on part of the outer region RO via the field insulating film 3. The outer peripheral edge (right edge in FIG. 15) of the peripheral structure 7 is preferably located inward (leftward) of the outer peripheral edge (right edge in FIG. 15) of the high concentration portion 21b of the terminal well region 20. The material and thickness of the peripheral structure 7 may be the same as those in the case of Embodiment 1.

The surface protective film 6 covers the edge of the front surface electrode 50 and specifically covers the edges of the source electrode 51 and the gate line electrode 52. The surface protective film 6 also covers at least part of the outer region RO of the epitaxial substrate 30. As illustrated in FIG. 16, the surface protective film 6 has an opening above the central portion of the source electrode 51 and above part of the gate pad 52p so that the source electrode 51 and the gate pad 52p of the gate line electrode 52 can function as external terminals.

In Embodiment 5, the peripheral structure 7 is engaged in the surface protective film 6 as in Embodiment 1. The surface protective film 6 is made of an insulating material different from the material for the peripheral structure 7. The material for the surface protective film 6 is preferably a resin in order to relieve stresses caused by an external environment and is, for example, polyimide.

In Embodiment 5, the outer peripheral edge of the peripheral structure 7 is located inward of the outer peripheral edge of the terminal well region 20 as in Embodiment 1. Like the maximum depletion layer MDL (FIG. 3) of the SBD 100, a maximum depletion layer is also assumed to be formed in the MOSFET 500, and the peripheral structure 7 is preferably spaced inward from this maximum depletion layer. The distance between the peripheral structure 7 and the front surface electrode 50 is preferably less than or equal to the thickness of at least either of the front surface electrode 50 and the peripheral structure 7 and more preferably less than or equal to the thickness of each of the front surface electrode 50 and the peripheral structure 7.

The active region RA (FIG. 15) of the MOSFET 500 has a structure that is a repetition of a plurality of unit cells UC (FIG. 17). Each unit cell UC includes an element well region 9, a contact region 19, and a source region 11. The element well region 9 and the contact region 19 are of the p-type. The contact region 19 has a higher impurity concentration than the impurity concentration of the element well region 9. The element well region 9 is arranged on the drift layer 1 and faces the front surface S2. The contact region 19 is arranged on the element well region 9 and faces the front surface S2. The contact region 19 extends from the front surface S2 and reaches the element well region 9. The source region 11 is of the n-type.

The source electrode 51 is in contact with the source region 11. The source electrode 51 is also in contact with the contact region 19 so as to form an ohmic contact with the contact region 19. The source electrode 51 is also in contact with the high concentration portion 21b of the terminal well region 20 so as to form an ohmic contact with the high concentration portion 21b of the terminal well region 20. In the front surface S2, the source region 11 is isolated from the drift layer 1 by the element well region 9. On the front surface S2, the gate insulating film 12 spans the drift layer 1, the element well region 9, and the source region 11. The gate electrode 13 is arranged on part of or the entire surface of the gate insulating film 12. The interlayer insulating film 14 covers the gate insulating film 12 and the gate electrode 13 so as to insulate the gate electrode 13 from the source electrode 51. The gate electrode 13 is also arranged on part of the surface of the boundary portion 21 of the terminal well region 20 via the gate insulating film 12.

In the case where a plan layout is as illustrated in FIG. 16, the gate line electrode 52 surrounds the inner region RI. The interlayer insulating film 14 has an opening along the outer periphery of the inner region RI as illustrated in FIG. 15. The gate electrode 13 of each unit cell UC is connected to the gate line 52w of the gate line electrode 52 along the outer periphery of the active region RA. The peripheral structure 7 is arranged away from the gate line electrode 52 so as to surround the gate line electrode 52.

As a variation of the plan layout, a p-type well having a large area may be formed in the active region RA, and the gate line 52w may be arranged above this p-type well. In that case, the gate electrode 13 of each unit cell UC is connected to the gate line 52w via the opening of the interlayer insulating film 14. In the case of this variation, the gate line 52w is arranged inside the active region RA.

In the present embodiment described above, the first conductivity type is the n-type and the second conductivity type is the p-type, but the first conductivity type may be the p-type and the second conductivity type may be the n-type. Also, although the epitaxial substrate 30 is made of SiC, which is one type of wide-bandgap materials, other wide-bandgap materials may be used, instead of SiC. Instead of wide-bandgap materials, other materials such as Si may be used. The semiconductor device may be a transistor other than an MOSFET, and for example, may be a junction FET (JFET) or an insulated gate bipolar transistor (IGBT). Although the transistor according to the present embodiment is of a planar type, the transistor may be of a trench type.

Variations

As a first variation, the moisture-resistant insulating film 15 (FIG. 4: variation of Embodiment 1) may be applied to Embodiment 5. When applied to the present embodiment, the moisture-resistant insulating film 15 is arranged on the outer peripheral edge of the front surface electrode 50 (the source electrode 51 and the gate line electrode 52), on the interlayer insulating film 14, on the peripheral structure 7, and on the field insulating film 3. As a second variation, the peripheral structure 7 may include the outer portion 7o and the inner portion 7i (see the variation of Embodiment 1 illustrated in FIG. 5). As a third variation, the peripheral structure 7 may adopt the shape illustrated in FIG. 6 (variation of Embodiment 1). In that case, it is preferable that no communicating regions are provided in the vicinity of corners where the front surface electrode 50 has a curvature in plan view. According to these other variations, it is possible to achieve substantially the same effects as those obtained when these variations are applied to Embodiment 1.

As a fourth variation, the field insulating film 3 may have the inner opening 3i (see the variation of Embodiment 2 illustrated in FIG. 8). When applied to the present embodiment, the field insulating film 3 has the inner opening 3i in which the surface protective film 6 is engaged, between the front surface electrode 50 and the peripheral structure 7. According to this variation, it is possible to achieve substantially the same effect as that achieved when this variation is applied to Embodiment 2.

As a fifth variation, the interlayer insulating film 14 may be formed so as to extend onto the surface of the field insulating film 3, and the peripheral structure 7 may be arranged on the field insulating film 3 via the interlayer insulating film 14. According to this variation, the interlayer insulating film 14 may have an opening in which the surface protective film 6 is engaged, between the front surface electrode 50 and the peripheral structure 7. In this case, it is possible to achieve an effect similar to that achieved when the inner opening 3i (FIG. 8) is provided in the aforementioned fourth variation. This opening preferably has a width less than or equal to the thickness of the interlayer insulating film 14. Note that this opening may completely surround the front surface electrode 50 in plan view. Alternatively, a plurality of openings spaced from one another may be provided around the front surface electrode 50, and in that case, the openings do not completely surround the front surface electrode 50 in plan view.

Manufacturing Method

Next, an example of a method for manufacturing the MOSFET 500 according to Embodiment 5 will be described below.

First, the monocrystalline substrate 31 made of an n$^+$ type low-resistance SiC semiconductor and having an off angle is prepared. On the monocrystalline substrate 31, the epitaxial layer 32 including a portion that is made into the drift layer 1 is formed by epitaxially growing SiC of an n type having an impurity concentration higher than or equal to $1 \times 10^{14}$/cm$^3$ and lower than or equal to $1 \times 10^{17}$/cm$^3$.

Then, the formation of a resist film (not shown) using a photolithographic process and ion implantation using the resist film as a mask are repeated. As a result, the terminal well region 20, the terminal well regions 9, the contact regions 19, and the source regions 11 are formed in the surface layer of the drift layer 1. The ion implantation uses, for example, nitrogen (N) as an ionic species of an n-type semiconductor and uses, for example, Al or B as an ionic species of a p-type semiconductor. The terminal well regions 9 and the low concentration portion 21a of the terminal well region 20 may be formed at once. The contact regions 19 and the high concentration portion 21b of the terminal well region 20 may be formed at once. The terminal well regions 9 and the low concentration portion 21a of the terminal well region 20 preferably have impurity concentrations higher than or equal to $1.0 \times 10^{18}$/cm$^3$ and lower than or equal to $1.0 \times 10^{20}$/cm$^3$. The source regions 11 have a higher impurity concentration than the impurity concentration of the terminal well regions 9. The dose of the extension portion 22 of the terminal well region 20 is preferably higher than or equal to $0.5 \times 10^{13}$/cm$^2$ and lower than or equal to $5 \times 10^{13}$/cm$^2$ and is, for example, $1.0 \times 10^{13}$/cm$^2$. In the case of Al ion implantation, implantation energy is, for example, higher than or equal to 100 keV and lower than or equal to 700 keV. In this case, the impurity concentration of the extension portion 22 converted from the above dose [cm$^{-2}$] is higher than or equal to $1 \times 10^{17}$/cm$^3$ and lower than or equal to $1 \times 10^{19}$/cm$^3$.

Thereafter, annealing is conducted at 1500° C. or higher. This activates the impurity implanted by the ion implantation.

Next, an SiO$_2$ film with a thickness approximately higher than or equal to 0.5 μm and lower than or equal to 2 μm is deposited by, for example, CVD on the front surface S2 of the epitaxial substrate 30. Thereafter, the field insulating film 3 is formed on part of the front surface S2 through patterning using a photolithographic process and an etching process.

Then, the surface of the epitaxial layer 32 that is not covered with the field insulating film 3 is thermally oxidized to form an $SiO_2$ film, which is the gate insulating film 12 having a desired thickness. Next, a polycrystalline silicon film having conductivity is formed by vacuum CVD on the gate insulating film 12 and patterned into the gate electrode 13.

Then, the interlayer insulating film 14 is formed by CVD. Then, the interlayer insulating film 14 and the gate insulating film 12 are perforated to make a contact hole that reaches the contact region 19 and the source region 11. At the same time, on the outer side of the active region RA, the interlayer insulating film 14 is perforated to make a contact hole that reaches the gate electrode 13.

Then, the peripheral structure 7 is formed at a desired position on the surface of the field insulating film 3 by, for example, a deposition process using CVD, a photolithographic process, and an etching process. As a variation, patterning may be performed so that the peripheral structure 7 is formed at the same time when the interlayer insulating film 14 is formed. Alternatively, the interlayer insulating film 14 may be formed so as to extend onto the surface of the field insulating film 3, and the peripheral structure 7 may be formed at a desired position on the surface of the interlayer insulating film 14.

Moreover, the front surface electrode 50 and the rear surface electrode 8 are formed by a deposition process using sputtering or vapor deposition and a patterning process. The process for depositing the source electrode 51 of the front surface electrode 50 uses, for example, at least one of metals such as Ni, Ti, and Al. The process for depositing the rear surface electrode 8 uses, for example, at least one of metals such as Ni and Au. Portions of the source electrode 51 and the rear surface electrode 8 that come in contact with the epitaxial substrate 30 are silicided by heat treatment.

Next, the surface protective film 6 is formed so as to cover the outer peripheral edge of the front surface electrode 50 and the front surface S2 on which the peripheral structure 7 and other constituent elements are provided. The surface protective film 6 is formed into a desired shape by, for example, applying and exposing a coating of photosensitive polyimide. In this way, the MOSFET 500 is obtained.

Operations

Next, operations of the MOSFET 500 (FIG. 15) will be described below, divided into two states.

The first state refers to a state in which a positive voltage greater than or equal to a threshold value is applied to the gate electrode 13, and is hereinafter referred to as an "ON state." In the ON state, an inversion channel is formed in a channel region. The inversion channel serves as a path for flowing electrons, which are carriers, between the source regions 11 and the drift layer 1. In the ON state, when a high voltage is applied to the rear surface electrode 8 with reference to the source electrode 51, current flows through the monocrystalline substrate 31 and the drift layer 1. At this time, the voltage between the source electrode 51 and the rear surface electrode 8 is referred to as an "on-state voltage," and the flow of current is referred to as "on-state current". The on-state current flows through only the active region RA where the channel exists, and does not flow to the termination area outside the active region RA.

The second state refers to a state in which a voltage less than the threshold value is applied to the gate electrode 13, and is referred to as an "OFF state." In the OFF state, the on-state current does not flow because an inversion carrier is not formed in the channel region. Thus, when a high voltage is applied between the source electrode 51 and the rear surface electrode 8, this high voltage is maintained. At this time, the voltage between the gate electrode 13 and the source electrode 51 is considerably smaller than the voltage between the source electrode 51 and the rear surface electrode 8, and therefore a high voltage is also applied between the gate electrode 13 and the rear surface electrode 8.

In the termination area outside the active region RA, a high voltage is also applied between the rear surface electrode 8 and each of the gate line electrode 52 and the gate electrode 13. Since the electrical contact with the source electrode 51 is formed in the boundary portion 21 of the terminal well region 20 similarly to the case where the electrical contact with the source electrode 51 is formed in the terminal well regions 9 of the active region RA, it is possible to prevent the application of a high electric field to the gate insulating film 12 and the interlayer insulating film 14.

The termination area outside the active region RA operates similarly to in the OFF state described in Embodiments 1 to 4. That is, a high electric field is applied to the vicinity of the interface of the pn junction between the drift layer 1 and the terminal well region 20, and if a voltage that exceeds a critical field is applied to the rear surface electrode 8, an avalanche breakdown will occur. Ordinarily, the MOSFET 500 is used in a range in which an avalanche breakdown does not occur, and the rated voltage thereof is prescribed in that range.

In the OFF state, a depletion layer expands from the interface of the pn junction between the drift layer 1 and each of the element well region 9 and the terminal well region 20 in a direction toward the monocrystalline substrate 31 (down direction in the drawing) and in a direction toward the outer periphery of the drift layer 1 (right direction in the drawing).

Here, consider a case where the MOSFET 500 enters the OFF state at high humidity. The surface protective film 6, which has a high water absorbing property, contains a large amount of moisture at high humidity. This moisture reaches the surfaces of the field insulating film 3, the interlayer insulating film 14, the front surface electrode 50, and the peripheral structure 7. Here, with the voltage applied to the MOSFET 500, the outer peripheral side of the drift layer 1 acts as an anode, and the front surface electrode 50 acts as a cathode. In the vicinity of the front surface electrode 50 serving as a cathode, a reduction reaction of oxide and a production reaction of hydrogen occur as described above in Embodiment 1. Following this, the concentration of hydroxide ions increases in the vicinity of the front surface electrode 50. When a negative voltage is applied to the gate line electrode 52, the concentration of hydroxide ions further increases. As a result of the hydroxide ions chemically reacting with the front surface electrode 50, an insulator is deposited on the upper and side faces of the front surface electrode 50 at the outer peripheral edge (right edge in FIG. 15) of the front surface electrode 50.

This deposition forces the surface protective film 6 up and may consequently cause separation at the interface between the front surface electrode 50 and the surface protective film 6. The separation of the surface protective film 6 may propagate over the interlayer insulating film 14 and the field insulating film 3. In other words, the separation may also occur at the interface between the surface protective film 6 and each of the interlayer insulating film 14 and the field insulating film 3. This separation occurs more markedly when the gate line electrode 52, to which a negative voltage is applied, is formed so as to surround the active region RA. If this separation forms a cavity above the terminal well region 20, an excessive flow of leakage current may occur due to intrusion of moisture into the cavity, or a device breakdown of the MOSFET 500 may be caused by, for example, aerial discharge in the cavity. According to the present embodiment, the peripheral structure 7 is provided on the outer peripheral side of the front surface electrode 50. The peripheral structure 7 can thus prevent the separation of the surface protective film 6 from the field insulating film 3, which occurs from the outer peripheral edge of the front surface electrode 50 toward the outer periphery of the drift layer 1.

Summary of Effects

The surface protective film 6 is made of a material different from the material for the peripheral structure 7. Thus, a material having an excellent capability of relieving stresses caused by the influence of an external environment can be appropriately selected as the material for the surface protective film 6. On the other hand, the material for the peripheral structure 7, which may be different from the material for the surface protective film 6, can be selected by prioritizing the purpose of suppressing separation of the peripheral structure 7 from the epitaxial substrate 30. Here, since the peripheral structure 7 is engaged in the surface protective film 6, the separation of the surface protective film 6 from the peripheral structure 7 does not readily occur. Thus, even if the surface protective film 6 starts to be separated from the vicinity of the outer peripheral edge of the front surface electrode 50, this separation is prevented from extending to the outside beyond the vicinity of the peripheral structure 7. Accordingly, the surface protective film 6 can maintain insulation protection in the range from the peripheral structure 7 to the outside. This improves the insulation reliability of the MOSFET 500.

In general, an electric field inside a semiconductor is readily concentrated in particular in the vicinity of a pn junction. In the present embodiment, an electric field is readily concentrated in the vicinity of the pn junction formed by the drift layer 1 and the terminal well region 20. Thus, on the front surface S2, an electric field is readily concentrated in the vicinity of the outer peripheral edge (right edge in FIG. 15) of the terminal well region 20. This readily forms a high electric field region on the field insulating film 3 around the outer peripheral edge of the terminal well region 20. If the separation of the surface protective film 6 extends to this high electric field region, aerial discharge readily occurs. In the case where the outer peripheral edge (right edge in FIG. 15) of the peripheral structure 7 is located inward (leftward in FIG. 15) of the outer peripheral edge (right edge in FIG. 15) of the terminal well region 20, the separation of the surface protective film 6 is prevented from extending to the above high electric field region. Accordingly, it is possible to avoid a situation where aerial discharge is caused by the above separation.

A high electric field region is readily formed on the field insulating film 3 around the region where a maximum depletion layer (see the maximum depletion layer MDL in FIG. 3) comes in contact with the front surface S2. If the separation of the surface protective film 6 extends to this high electric field region, aerial discharge readily occurs. In the case where the peripheral structure 7 is spaced from the maximum depletion layer, the separation of the surface protective film 6 is prevented from extending to the above high electric field region. Accordingly, it is possible to avoid a situation where aerial discharge is caused by the above separation.

The outer peripheral edge of the peripheral structure 7 may be located inward of the outer peripheral edge of the high concentration portion 21b of the terminal well region 20. This makes it difficult for the depletion layer, which expands from the pn junction between the drift layer 1 and the terminal well region 20 to the inside of the terminal well region 20 in the OFF state, to reach the outer peripheral edge of the peripheral structure 7.

The distance between the peripheral structure 7 and the front surface electrode 50 is preferably less than or equal to the thickness of at least either of the front surface electrode 50 and the peripheral structure 7, and more preferably less than or equal to the thickness of each of the front surface electrode 50 and the peripheral structure 7. This increases the aspect ratio of a recess formed by the front surface electrode 50 and the peripheral structure 7. Thus, the surface protective film 6 is more firmly fixed in this recess. Accordingly, even if the surface protective film 6 starts to be separated from the vicinity of the outer peripheral edge of the front surface electrode 50, this separation is more reliably prevented from extending to the outside beyond the vicinity of the peripheral structure 7.

Embodiment 6

Configuration

Figure 18:
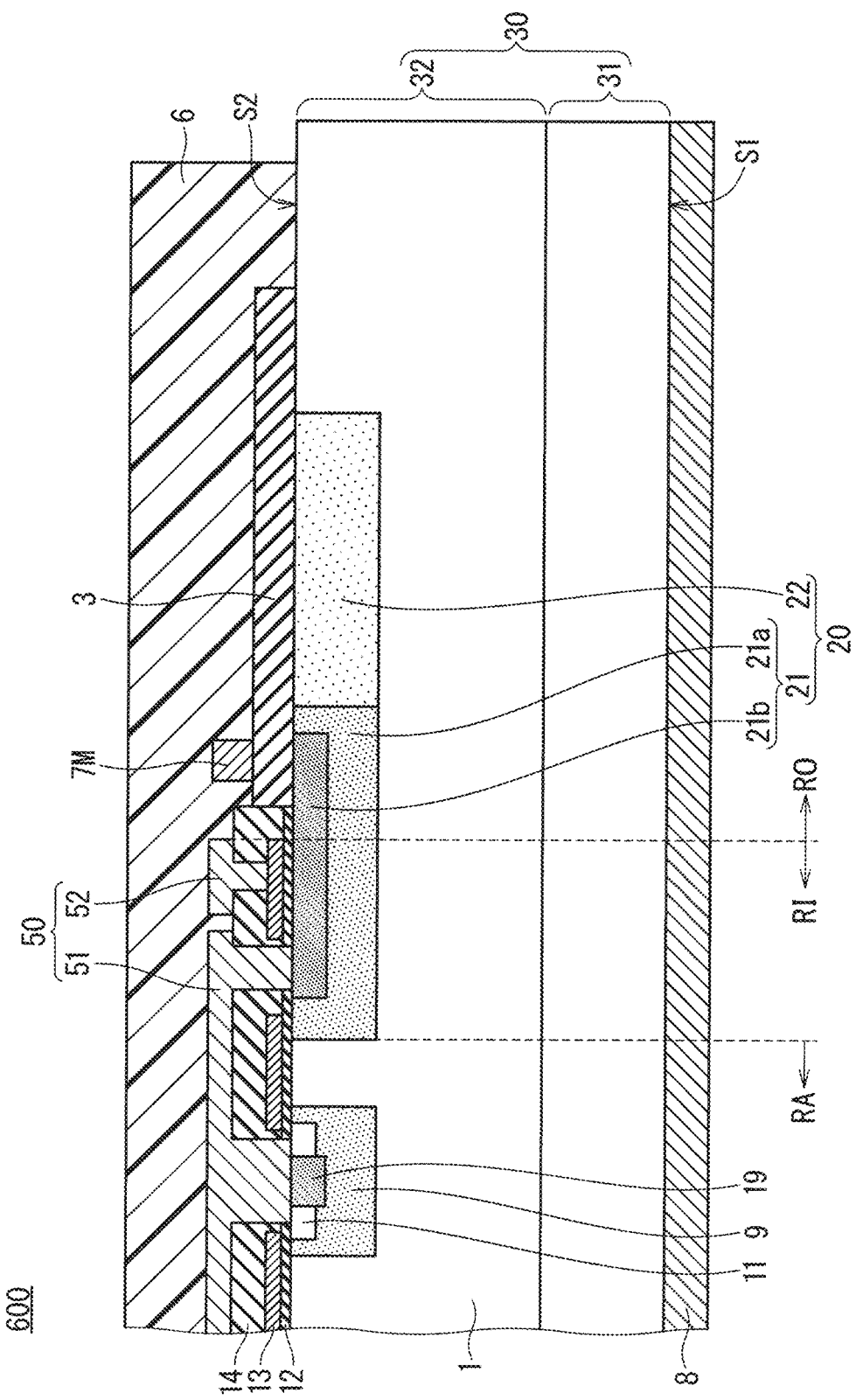
FIG. 18 is a partial sectional view schematically illustrating a configuration of an MOSFET as an example of a semiconductor device according to Embodiment 6 of the present invention.

FIG. 18 is a partial sectional view schematically illustrating a configuration of an MOSFET 600 (semiconductor device) according to Embodiment 6 of the present invention. The MOSFET 600 includes a peripheral structure 7M made of a conductive material, instead of the peripheral structure 7 made of an insulating material (FIG. 15: Embodiment 5). The material for the peripheral structure 7M may be the material described above in Embodiment 3. The peripheral structure 7M may be arranged in the same manner as the peripheral structure 7.

Note that the configuration other than that described above is substantially the same as the configuration described above in Embodiment 5, and therefore elements that are identical or correspond to those of Embodiment 5 are given the same reference signs and descriptions thereof shall not be repeated.

Variations

Figure 19:
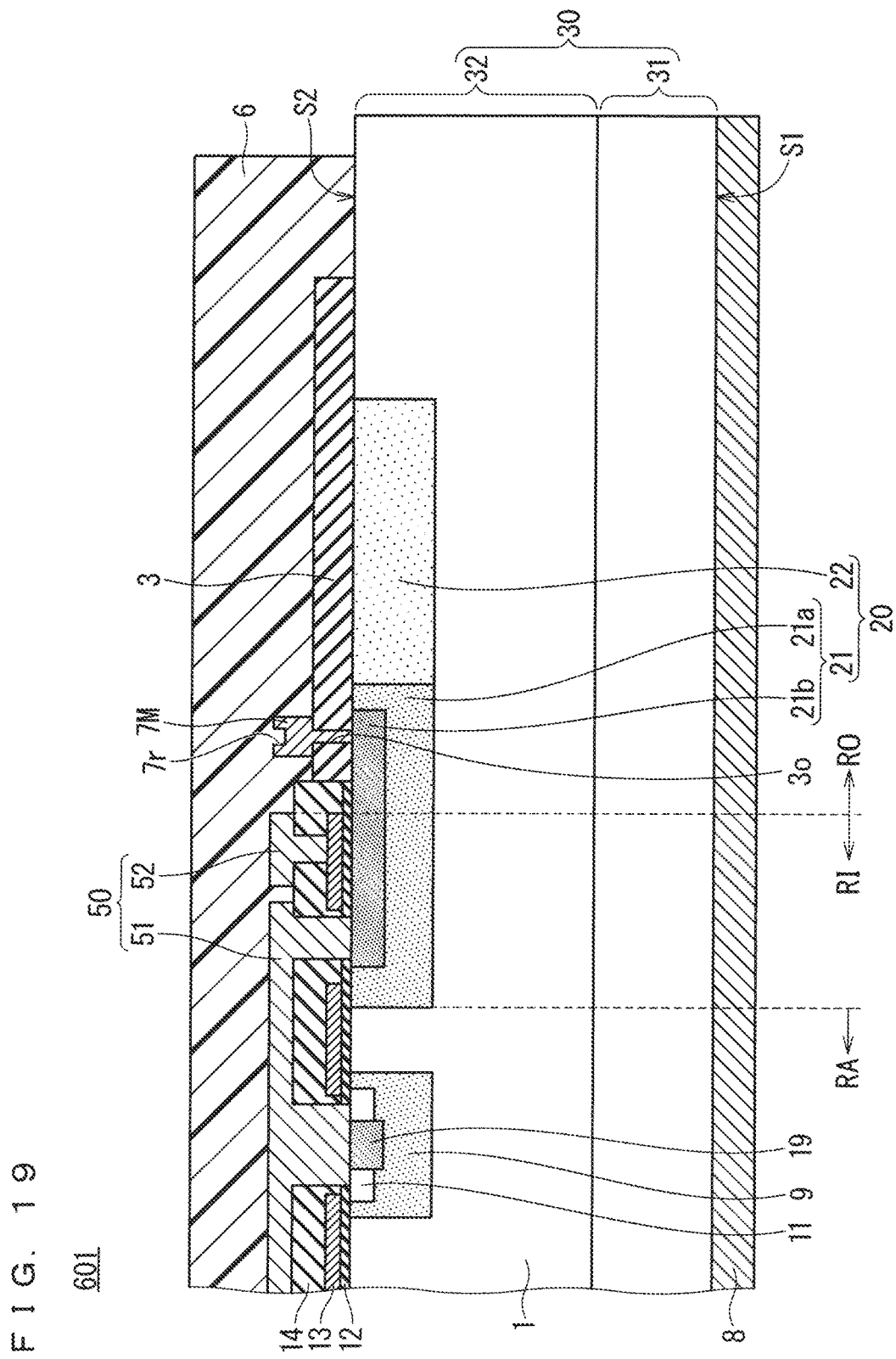
FIG. 19 is a partial sectional view of an MOSFET as a variation of the semiconductor device according to Embodiment 6 of the present invention.

FIG. 19 is a partial sectional view of an MOSFET 601 as a variation of the MOSFET 600. In the MOSFET 601, the field insulating film 3 has an outer opening 3o in which the peripheral structure 7M is engaged. In this variation, the high concentration portion 21b of the boundary portion 21 of the terminal well region 20 is electrically connected to the peripheral structure 7M. According to this variation, for the same reason as that in the case of the SBD 402 (FIG. 14: variation of Embodiment 4), the separation of the surface protective film 6 is more reliably prevented from extending to the outside beyond the vicinity of the peripheral structure 7M.

As another variation, the interlayer insulating film 14 may be formed so as to extend on the surface of the field insulating film 3, and the peripheral structure 7M may be arranged on the field insulating film 3 via the interlayer insulating film 14. According to this variation, a laminated structure of the field insulating film 3 and the interlayer insulating film 14 may have an opening in which the peripheral structure 7M is engaged. In that case, the high concentration portion 21b of the boundary portion 21 of the terminal well region 20 is electrically connected to the peripheral structure 7M.

As yet another variation, the moisture-resistant insulating film 15 (FIG. 4: variation of Embodiment 1) may be applied to Embodiment 6 of the present invention. When applied to the present embodiment, the moisture-resistant insulating film 15 is arranged on the outer peripheral edge of the front surface electrode 5 (the source electrode 51 and the gate line electrode 52), on the interlayer insulating film 14, on the peripheral structure 7M, and on the field insulating film 3. As yet another alternative, the peripheral structure 7M may include the outer portion 7o and the inner portion 7i (see the variation of Embodiment 1 illustrated in FIG. 5). As yet another alternative, the peripheral structure 7M may adopt the shape of the peripheral structure 7 illustrated in FIG. 6 (variation of Embodiment 1). In that case, it is preferable that no communicating regions are provided in the vicinity of the corners where the front surface electrode 50 has a curvature in plan view. According to these variations, it is possible to achieve substantially the same effects as those achieved when these variations are applied to Embodiment 1.

As yet another alternative, the field insulating film 3 may have the inner opening 3i (see the variation of Embodiment 2 illustrated in FIG. 8). When applied to the present embodiment, the field insulating film 3 has an inner opening 3i in which the surface protective film 6 is engaged, between the front surface electrode 50 and the peripheral structure 7. According to this variation, it is possible to achieve substantially the same effect as that achieved when this variation is applied to Embodiment 2.

Manufacturing Method

Next, an example of a method for manufacturing the MOSFET 600 according to Embodiment 6 of the present invention will be described. The steps performed up until the formation of the gate electrode 13 are the same as those described above in Embodiment 5, and therefore descriptions thereof shall be omitted.

After the aforementioned steps, the interlayer insulating film 14 is formed by CVD. Then, the interlayer insulating film 14 and the gate insulating film 12 are perforated to make a contact hole that reaches the contact region 19 and the source region 11. At the same time, outside the active region RA, the interlayer insulating film 14 is perforated to make a contact hole that reaches the gate electrode 13.

Then, the front surface electrode 50 is formed by a deposition process such as sputtering or vapor deposition and a patterning process. At this time, the peripheral structure 7M may be formed at the same time. In that case, the peripheral structure 7M is made of the same material as the material for the front surface electrode 50 and has the same thickness as the thickness of the front surface electrode 50. For example, the front surface electrode 50 and the peripheral structure 7M are formed of an Al film with a thickness of 5 μm. Moreover, the rear surface electrode 8 is formed by, for example, sputtering or vapor deposition on the rear surface S1 of the epitaxial substrate 30. Portions of the source electrode 51 and the rear surface electrode 8 that come in contact with the epitaxial substrate 30 are silicided by heat treatment. In the case of manufacturing the MOSFET 601 (FIG. 19), a portion of the peripheral structure 7 that comes in contact with the epitaxial substrate 30 may also be silicided by heat treatment.

Next, the surface protective film 6 is formed so as to cover the outer peripheral edge of the front surface electrode 50 and the surface on which the peripheral structure 7M and other constituent elements are provided. The surface protective film 6 is formed into a desired shape by, for example, applying and exposing a coating of photosensitive polyimide. In this way, the MOSFET 600 is obtained.

Operations

Next, operations of the MOSFET 600 (FIG. 18) will be described below. Note that basic operations regarding the "ON state" and "OFF state" of the MOSFET 500 according to Embodiment 5 are the same as those of the MOSFET 600 according to the present embodiment, and therefore descriptions thereof shall be omitted.

Unlike Embodiment 5, Embodiment 6 of the present invention uses the peripheral structure 7M made of a conductive material, instead of the peripheral structure 7 made of an insulating material (FIG. 15). In the MOSFET 600 (FIG. 18), the peripheral structure 7M is present on the field insulating film 3. Thus, in the OFF state, the peripheral structure 7M has an intermediate potential between the potential of the front surface electrode 50 serving as a cathode and the potential on the outer peripheral side of the epitaxial layer 32 serving as an anode. In the MOSFET 601 (FIG. 19), the peripheral structure 7M made of a conductive material is electrically connected to the source electrode 51 of the front surface electrode 50 via the boundary portion 21 of the terminal well region 20. Here, the terminal well region 20 has a higher resistivity than the resistivities of the front surface electrode 50 and the peripheral structure 7M. Thus, the peripheral structure 7M has a higher potential than the potential of the source electrode 51 of the front surface electrode 50 in the OFF state due to the electrical resistance of the terminal well region 20. Accordingly, the front surface electrode 50 rather than the peripheral structure 7M primarily acts as a cathode that involves generation of OH⁻ ions. Accordingly, an insulator arising from the generation of OH⁻ ions is not deposited on the upper and side faces of the peripheral structure 7M. This avoids the surface protective film 6 from being separated from the peripheral structure 7M due to this deposit. Accordingly, like the peripheral structure 7 (FIG. 15: Embodiment 5), the peripheral structure 7M has a function of stopping the separation of the surface protective film 6 from the field insulating film 3, which occurs from the outer peripheral edge of the front surface electrode 50 toward the outer periphery of the drift layer 1.

In the OFF state, a depletion layer expands from the pn junction formed between the drift layer 1 and each of the element well region 9 and the terminal well region 20 to the insides of the drift layer 1, the element well region 9, and the terminal well region 20. Like the maximum depletion layer MDL (FIG. 3) of the SBD 100, a maximum depletion layer is also assumed to be formed in the MOSFET 600. If the applied voltage is increased up to a limit, a maximum depletion layer is formed. Since the depletion layer has a potential gradient, if the depletion layer in the surface of the terminal well region 20 reaches immediately below the outer peripheral edge of the conductive peripheral structure 7M, a remarkably large potential difference may occur at the outer peripheral edge of the peripheral structure 7M. Then, due to a resultant excessive electric field concentration, a breakdown may occur at the outer peripheral edge of the peripheral structure 7M. In particular, in the case of the MOSFET 601 (FIG. 19) according to the variation, the peripheral structure 7M is in direct contact with the epitaxial substrate 30 and is therefore adversely affected considerably by the electric field concentration. From the above, the peripheral structure 7M is preferably arranged away from the maximum depletion layer.

Note that the element well region 9 and the boundary portion 21 of the terminal well region 20 usually have sufficiently higher impurity concentrations than the impurity concentration of the extension portion 22 of the terminal well region 20. Thus, the depletion layer expands little to the insides of the element well region 9 and the boundary portion 21 of the terminal well region 20. Thus, in the case where the outer peripheral edge of the high concentration portion 21b is located outward of the outer peripheral edge of the peripheral structure 7M as illustrated in FIG. 19, a breakdown is less likely to occur at the outer peripheral edge of the peripheral structure 7M even if the applied voltage has reached an avalanche voltage in the OFF state.

Summary of Effects

According to Embodiment 6 of the present invention, the peripheral structure 7M is provided on the outer peripheral side of the front surface electrode 50. Thus, for substantially the same reason as that of Embodiment 5, the peripheral structure 7M can prevent the separation of the surface protective film 6, which occurs from the outer peripheral edge of the front surface electrode 50 toward the outer periphery of the drift layer 1. Accordingly, the surface protective film 6 can maintain insulation protection in the range from the peripheral structure 7M to the outside. This improves the insulation reliability of the MOSFET 600.

The outer peripheral edge (right edge in FIG. 18) of the peripheral structure 7M is located inward (leftward in FIG. 18) of the outer peripheral edge (right edge in FIG. 18) of the terminal well region 20. This suppresses the concentration of an electric field at the outer peripheral edge of the peripheral structure 7M.

The peripheral structure 7M is preferably spaced from the aforementioned maximum depletion layer. This more reliably suppresses the concentration of an electric field at the outer peripheral edge of the peripheral structure 7M.

The outer peripheral edge of the peripheral structure 7M is preferably located inward of the outer peripheral edge of the high concentration portion 21b of the terminal well region 20. This more reliably suppresses the concentration of an electric field at the outer peripheral edge of the peripheral structure 7M.

Embodiment 7

The present embodiment applies the semiconductor device according to one of Embodiments 1 to 6 described above to a power converter. Although the present invention is not limited to a specific power converter, a case in which the present invention is applied to a three-phase inverter will be described below as Embodiment 7.

Figure 20:
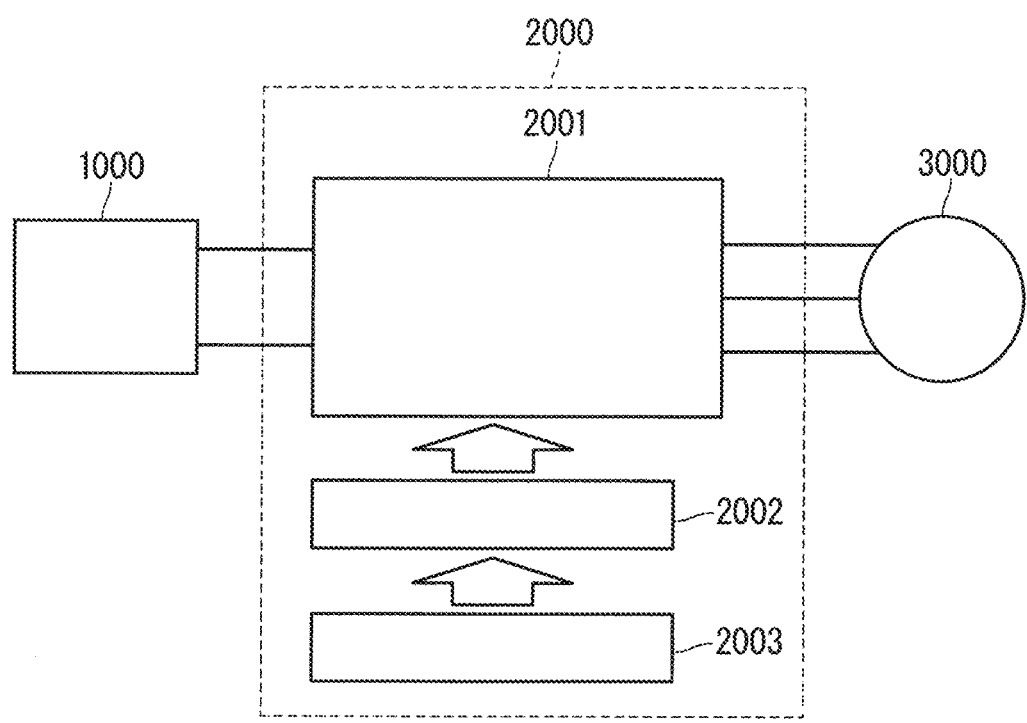
FIG. 20 is a block diagram schematically illustrating a configuration of a power conversion system to which a power converter according to Embodiment 7 of the present invention has been applied.

FIG. 20 is a block diagram schematically illustrating a configuration of a power conversion system that applies a power converter 2000 according to Embodiment 7 of the present invention. The power conversion system includes a power source 1000, the power converter 2000, and a load 3000. The power source 1000 is a direct-current power supply and supplies direct-current power to the power converter 2000. The power source 1000 may be configured by various constituent elements and, for example, may be configured by a direct-current system, a solar cell, and a storage battery or may be configured as a rectifier circuit or an AC/DC converter connected to an alternating-current system. As another alternative, the power source 1000 may be configured as a DC/DC converter that converts direct-current power output from a direct-current system into predetermined power.

The power converter 2000 is a three-phase inverter connected between the power source 1000 and the load 3000 and is configured to convert direct-current power supplied from the power source 1000 into alternating-current power and supply the alternating-current power to the load 3000. As illustrated in FIG. 20, the power converter 2000 includes a main converter circuit 2001 that converts direct-current power into alternating-current power and outputs the alternating-current power, a driving circuit 2002 that outputs driving signals for driving each switching element of the main converter circuit 2001, and a control circuit 2003 that outputs a control signal for controlling the driving circuit 2002 to the driving circuit 2002.

The load 3000 is a three-phase electric motor driven by the alternating-current power supplied from the power converter 2000. Note that the load 3000 is not limited for use in a specific application, and it is an electric motor mounted on various electrical apparatuses and used as, for example, an electric motor for a hybrid automobile, an electric automobile, a railway vehicle, an elevator, or an air conditioner.

Hereinafter, the power converter 2000 will be described in detail. The main converter circuit 2001 includes switching elements and freewheeling diodes (not shown). By switching the switching elements, the main converter circuit 2001 converts the direct-current power supplied from the power source 1000 into alternating-current power and supplies the alternating-current power to the load 3000. While the main converter circuit 2001 may come in a variety of specific circuit configurations, the main converter circuit 2001 according to the present embodiment is a two-level three-phase full-bridge circuit and includes six switching elements and six freewheeling diodes that are respectively connected in inverse-parallel to the six switching elements. The semiconductor device according to any of Embodiments 1 to 6 described above is applied to at least either of the switching elements and the freewheeling diodes in the main converter circuit 2001. Each two of the six switching elements are connected in series and configure upper and lower arms, and each pair of the upper and lower arms configures each phase (U phase, V phase, W phase) of the full-bridge circuit. Then, the output terminals of the pairs of the upper and lower arms, i.e., three output terminals of the main converter circuit 2001, are connected to the load 3000.

The driving circuit 2002 generates driving signals for driving the switching elements of the main converter circuit 2001 and supplies the driving signals to the control electrodes of the switching elements in the main converter circuit 2001. Specifically, in accordance with the control signal received from the control circuit 2003 described later, the driving circuit outputs a driving signal for turning on a switching element and a driving signal for turning off a switching element to the control electrode of each switching element. In the case of maintaining a switching element in the ON state, the driving signal is a voltage signal (ON signal) higher than a threshold voltage of the switching element, and in the case of maintaining a switching element in the OFF state, the driving signal is a voltage signal (OFF signal) lower than the threshold voltage of the switching element.

The control circuit 2003 controls the switching elements of the main converter circuit 2001 so that desired power is supplied to the load 3000. Specifically, on the basis of the power to be supplied to the load 3000, the control circuit 2003 calculates a time (turn-on time) when each switching element of the main converter circuit 2001 is to be turned on. For example, the control circuit 2003 can control the main converter circuit 2001 by pulse width modulation (PWM) control in which the turn-on time of each switching element is modulated in accordance with the voltage to be output. Then, the control circuit 2003 outputs a control command (control signal) to the driving circuit 2002 so that, at each time, an ON signal is output to a switching element that is to be turned on and an OFF signal is output to a switching element that is to be turned off. In accordance with this control signal, the driving circuit 2002 outputs either the ON signal or the OFF signal as a driving signal to each switching element.

In the power converter according to the present embodiment, the semiconductor devices according to Embodiments 1 to 4 are applicable as the freewheeling diodes of the main converter circuit 2001. Also, the semiconductor device according to Embodiment 5 or 6 is applicable to the switching elements of the main converter circuit 2001. This achieves an improvement in reliability.

Although the present embodiment has described an example of applying the present invention to a two-level three-phase inverter, the present invention is not limited to this example and is applicable to various power converters. Although the power converter according to the present embodiment is a two-level converter, the power converter may be a multi-level converter such as a three-level converter. In the case of supplying power to a single-phase load, the present invention may be applied to a single-phase inverter. In the case of supplying power to, for example, a direct-current load, the present invention may also be applied to a DC/DC converter or an AC/DC converter.

The power converter that applies the present invention is not limited for use in the case where the load is an electric motor. It may be used in, for example, power supply units for electric discharge machines, laser beam machines, laser processing machines, induction heating cooking appliances, or non-contact power supply systems, or may also be used as a power conditioner for photovoltaic power generating systems, electric condenser systems, or other systems.

While some of the above-described embodiments have described, for example, the physical properties, material, dimensions, shape, and relative positions in arrangement of each constituent element or conditions for implementation, these features are illustrative in all aspects and do not intend to limit the present invention. Therefore, an unlimited number of variations that are not exemplified are assumed to fall within the scope of the present invention. For example, the scope of the technique is assumed to include cases where any constituent element is modified, added, or omitted and cases where at least one constituent element in at least one embodiment is extracted and combined with constituent elements in the other embodiments.

In each embodiment described above, any constituent element that is assumed to be "one" in the description may include "one or more" constituent elements as long as no contradiction arises. Constituent elements that form the present invention are conceptual units, and one constituent element may be configured by a plurality of structures, or one constituent element may correspond to part of a structure. Moreover, each constituent element of the present invention may include a structure having a different configuration or shape as long as it can achieve the same function.

Note that each embodiment of the present invention may be freely combined or may be appropriately modified or omitted within the scope of the invention. While the present invention has been described in detail, the foregoing description is in all aspects illustrative and not restrictive. It is therefore to be understood that numerous modifications and variations can be devised without departing from the scope of the present invention. The descriptions in the specification of the specification of the present invention shall be referred to for all purposes relating to the technique of the present invention, and nothing in the specification shall be regarded as conventional technology.

EXPLANATION OF REFERENCE SIGNS

S1: rear surface (first surface), S2: front surface (second surface), RA: active region, UC: unit cell, RI: inner region, RO: outer region, MDL: maximum depletion layer, 1: drift layer, 2, 20: terminal well region, 2a, 21a: low-concentration portion, 2b, 21b: high-concentration portion, 3: field insulating film, 3i: inner opening, 3o: outer opening, 5, 50: front surface electrode, 5a: Schottky electrode, 5b: electrode pad, 6: surface protective film, 7, 7M: peripheral structure, 7a: portion (first portion), 7b: portion (second portion), 7i: inner portion, 7o: outer portion, 7r: recess, 8: rear surface electrode, 9: element well region, 11: source region, 12: gate insulating film, 13: gate electrode, 14: interlayer insulating film, 15: moisture-resistant insulating film, 19: contact region, 21: boundary portion, 22: extension portion, 30: epitaxial substrate (semiconductor substrate), 31: monocrystalline substrate (support substrate), 32: epitaxial layer (semiconductor layer), 51: source electrode (main electrode portion), 52: gate line electrode (control line electrode portion), 52p: gate pad, 52w: gate line, 100 to 103, 200 to 202, 300, 301, 400 to 402: SBD (semiconductor device), 500, 600, 601: MOSFET (semiconductor device), 1000: power source, 2000: power converter, 2001: main converter circuit, 2002: driving circuit, 2003: control circuit, 3000: load.

The invention claimed is:
1. A semiconductor device comprising:
a semiconductor substrate having a first surface and a second surface opposite to the first surface, the second surface including:
an inner region and an outer region outside the inner region, the semiconductor substrate including a drift layer of a first conductivity type, and
a terminal well region of a second conductivity type different from the first conductivity type, the terminal well region including a portion that extends from between the inner region and the outer region toward the outer region in the second surface;
a first electrode provided on the first surface of the semiconductor substrate;
a second electrode provided on at least part of the inner region of the semiconductor substrate and electrically connected to the terminal well region and having an edge located on a boundary between the inner region and the outer region, the edge of the second electrode being an outer edge of the second electrode in a plan view, the outer edge being separated from any electrode different from the second electrode;
a peripheral structure provided on part of the outer region of the semiconductor substrate, away from the second electrode; and
a surface protective film that covers the edge of the second electrode and at least part of the outer region of the semiconductor substrate, has the peripheral structure engaged therein, and is made of an insulating material different from a material for the peripheral structure, wherein an outer peripheral edge of the peripheral structure is located inward of an outer peripheral edge of the terminal well region.

2. The semiconductor device according to claim 1, wherein
the peripheral structure is made of a conductive material.

3. The semiconductor device according to claim 1, wherein
a depletion layer that extends from a boundary between the drift layer and the terminal well region when an avalanche voltage is applied to the semiconductor device is defined as a maximum depletion layer, and
the peripheral structure is spaced from the maximum depletion layer.

4. The semiconductor device according to claim 1, wherein
the terminal well region includes a first portion and a second portion in the second surface of the semiconductor substrate, the second portion having a higher impurity concentration than an impurity concentration of the first portion, and
an outer peripheral edge of the peripheral structure is located inward of an outer peripheral edge of the second portion of the terminal well region.

5. The semiconductor device according to claim 1, wherein
a distance between the second electrode and the peripheral structure is less than or equal to a thickness of at least one of the second electrode and the peripheral structure.

6. The semiconductor device according to claim 1, wherein
the peripheral structure includes an outer portion and an inner portion that is located between the outer portion and the second electrode away from the outer portion, and
the surface protective film is engaged in a space between the inner portion and the outer portion of the peripheral structure.

7. The semiconductor device according to claim 1, wherein
the peripheral structure includes a first portion and a second portion spaced from the first portion, and
the surface protective film is engaged in a first space between the second electrode and the first portion of the peripheral structure, a second space between the second electrode and the second portion of the peripheral structure, and a third space between the first portion of the peripheral structure and the second portion of the peripheral structure.

8. The semiconductor device according to claim 7, wherein
a distance between the first portion of the peripheral structure and the second portion of the peripheral structure is less than or equal to a thickness of the peripheral structure.

9. The semiconductor device according to claim 1, further comprising:
a field insulating film that includes a portion arranged on the outer region of the second surface of the semiconductor substrate, wherein
the edge of the second electrode is located on the second surface of the semiconductor substrate via the field insulating film, and
the peripheral structure is located on the field insulating film.

10. The semiconductor device according to claim 9, wherein
the field insulating film has an inner opening in which the surface protective film is engaged, in at least one space between the second electrode and the peripheral structure.

11. The semiconductor device according to claim 10, wherein
the inner opening of the field insulating film has a width less than or equal to a thickness of the field insulating film.

12. The semiconductor device according to claim 9, wherein
the field insulating film has an outer opening in which the peripheral structure is engaged.

13. The semiconductor device according to claim 12, wherein
the outer opening of the field insulating film has a width less than or equal to a thickness of the field insulating film.

14. The semiconductor device according to claim 1, wherein
the second electrode includes:
a main electrode portion electrically connected to the terminal well region; and
a control line electrode portion provided away from the main electrode part to receive a control signal for controlling an electrical path between the main electrode portion and the first electrode.

15. The semiconductor device according to claim 1, further comprising:
a moisture-resistant insulating film provided between the second electrode and the surface protective film and made of a material different from a material for the surface protective film.

16. The semiconductor device according to claim 1, wherein
the semiconductor substrate is made of silicon carbide.

17. A power converter comprising:
a main converter circuit that converts input power into a converted power and outputs the converted power and that includes the semiconductor device according to claim 1;
a driving circuit that outputs a driving signal for driving the semiconductor device to the semiconductor device; and
a control circuit that outputs a control signal for controlling the driving circuit to the driving circuit.

18. The semiconductor device according to claim 1, wherein
the second electrode is in direct contact with the terminal well region.

19. The semiconductor device according to claim 1, wherein
the portion of the terminal well region extends continuously from inside the inner region to inside the outer region.

20. The semiconductor device according to claim 1, wherein
the peripheral structure directly contacts the terminal well region.

* * * * *